United States Patent
Shim et al.

(10) Patent No.: US 8,084,805 B2
(45) Date of Patent: Dec. 27, 2011

(54) THREE-DIMENSIONAL MICROELECTRONIC DEVICES INCLUDING REPEATING LAYER PATTERNS OF DIFFERENT THICKNESSES

(75) Inventors: Sun-Il Shim, Seoul (KR); Sung-Hoi Hur, Seoul (KR); Jin-Ho Kim, Gyeonggi-do (KR); Su-Youn Yi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 230 days.

(21) Appl. No.: 12/420,518

(22) Filed: Apr. 8, 2009

(65) Prior Publication Data

US 2010/0078701 A1    Apr. 1, 2010

(30) Foreign Application Priority Data

Sep. 30, 2008  (KR) .................. 10-2008-0095780

(51) Int. Cl.
    *H01L 29/76*    (2006.01)
(52) U.S. Cl. ..................... 257/314; 257/E29.3
(58) Field of Classification Search .......... 257/314–326, 257/E29.3–E29.309, E21.19
    See application file for complete search history.

(56) References Cited

U.S. PATENT DOCUMENTS

| | | | |
|---|---|---|---|
| 4,809,044 A * | 2/1989 | Pryor et al. ................. 257/3 |
| 6,870,215 B2 | 3/2005 | Endoh et al. | |
| 6,933,556 B2 | 8/2005 | Endoh et al. | |
| 7,196,017 B2 * | 3/2007 | Mirkarimi et al. ............ 438/714 |
| 2001/0015485 A1 * | 8/2001 | Song et al. ..................... 257/679 |
| 2005/0051806 A1 | 3/2005 | Masuoka et al. | |
| 2006/0186446 A1 | 8/2006 | Kim et al. | |
| 2007/0158736 A1 * | 7/2007 | Arai et al. ..................... 257/315 |
| 2007/0252201 A1 | 11/2007 | Kito et al. | |
| 2008/0173928 A1 | 7/2008 | Arai et al. | |

FOREIGN PATENT DOCUMENTS

| | | |
|---|---|---|
| JP | 6-338602 A | 12/1994 |
| JP | 10-93083 A | 4/1998 |
| JP | 2007-180389 A | 7/2007 |
| JP | 2008-171968 A | 7/2008 |

OTHER PUBLICATIONS

Jansen et al. "A survey on the reactive ion etching of silicon in microtechnology" *J. Micromech. Microeng.* 6(14-28) (1996).

* cited by examiner

*Primary Examiner* — Kiesha Bryant
*Assistant Examiner* — Tucker Wright
(74) *Attorney, Agent, or Firm* — Myers Bigel Sibley & Sajovec, P.A.

(57) ABSTRACT

A vertical NAND flash memory device includes a substrate having a face and a string of serially connected flash memory cells on the substrate. A first flash memory cell is adjacent the face, and a last flash memory cell is remote from the face. The flash memory cells include repeating layer patterns that are stacked on the face, and a pillar that extends through the series of repeating layer patterns. The pillar includes at least one oblique wall. At least two of the series of repeating layer patterns in the string are of different thicknesses. Other vertical microelectronic devices and related fabrication methods are also described.

29 Claims, 26 Drawing Sheets

$W_i$ : Opening diameter
$CL_i$ : Circumference length (=$W_{ch}$)
$W_{ch}$ : Channel width
$L_{ch}$ : Channel length (=$t_i$)

[$W_4 > W_3 > W_2 > W_1$
$t_4 > t_3 > t_2 > t_1$]

$$\begin{bmatrix} W_4 > W_3 > W_2 > W_1 \\ t_4 > t_3 > t_2 > t_1 \end{bmatrix}$$

S : Common source region
70 : Plug $\begin{bmatrix} W_4 < W_3 < W_2 < W_1 \\ t_4 < t_3 < t_2 < t_1 \end{bmatrix}$

THREE-DIMENSIONAL MICROELECTRONIC DEVICES INCLUDING REPEATING LAYER PATTERNS OF DIFFERENT THICKNESSES

CROSS-REFERENCE TO RELATED APPLICATION

This application claims priority under 35 USC §119 to Korean Patent Application No. 10-2008-0095780, filed on Sep. 30, 2008, the disclosure of which is hereby incorporated herein by reference in its entirety as if set forth fully herein.

BACKGROUND OF THE INVENTION

This invention relates to microelectronic devices and fabrication methods therefor and, more particularly, to three-dimensional microelectronic devices and fabrication methods therefor.

Microelectronic devices are widely used in many consumer, commercial and other applications. As the integration density of microelectronic devices continues to increase, three-dimensional microelectronic devices may be fabricated, wherein active devices, such as transistors, are stacked on a microelectronic substrate, such as an integrated circuit substrate.

In particular, NAND flash memory devices are widely used for general storage and transfer of data in computers and other digital products. In NAND flash memory devices, a string of flash memory cells are connected in series. Moreover, in order to increase the integration density of NAND flash memory devices, three-dimensional or vertical NAND flash memory devices have been developed, wherein a string of serially connected flash memory cells is formed by the flash memory cells vertically being stacked on a face of a substrate, wherein a first flash memory cell in the string of serially connected flash memory cells is adjacent the face of the substrate and a last flash memory cell in the string of serially connected flash memory cells is remote from the face of the substrate. As used herein, and as conventionally used, the "vertical" direction is generally orthogonal to the face of the substrate, whereas the "horizontal" direction is generally parallel to (extending along) the face of the substrate. By vertically stacking the flash memory cells to form the string, increased integration density may be provided. These vertically stacked structures may also be referred to as "three-dimensional" flash memory devices.

Three-dimensional flash memory devices are described, for example, in U.S. Patent Application Publication No. 2008/0173928 to Arai et al., published Jul. 24, 2008; U.S. Patent Application Publication No. 2007/0252201 to Kito et al., published Nov. 1, 2007; U.S. Patent Application Publication No. 2007/0158736 to Arai et al., published Jul. 12, 2007; U.S. Patent Application Publication No. 2006/0186446 to Kim et al., published Aug. 24, 2006; U.S. Patent Application Publication No. 2005/0051806 to Masuoka et al., published Mar. 10, 2005; U.S. Pat. No. 6,933,556 to Endoh et al., issued Aug. 23, 2005; and U.S. Pat. No. 6,870,215 to Endoh et al, issued Mar. 22, 2005.

SUMMARY OF THE INVENTION

Vertical NAND flash memory devices according to various embodiments comprise a substrate having a face and a string of serially connected flash memory cells on the substrate. A first flash memory cell in the string of serially connected flash memory cells is adjacent the face and a last flash memory cell in the string of serially connected flash memory cells is remote from the face. The string of flash memory cells comprises a series of repeating layer patterns that are stacked on the face and a pillar that extends through the series of repeating layer patterns. The pillar includes at least one oblique wall. At least two of the series of repeating layer patterns in the string of serially connected flash memory cells are of different thicknesses.

Some embodiments of the invention may arise from recognition that it may be exceedingly difficult to form a high aspect ratio pillar that extends through a large number of repeating layer patterns while maintaining all the walls of the pillar orthogonal (perpendicular) to the substrate. As such, a slight deviation from orthogonality may be produced due to limitations in microelectronic manufacturing processes, such that the pillar includes at least one oblique wall. This one oblique wall may cause a wide variation in the performance of the various flash memory cells in the string, and thereby degrade performance of the flash memory device. In order to at least partially compensate for some of this deviation, at least two of the transistors in the string of flash memory cells are of different thicknesses. Thus, at least two of the plurality of repeating layer patterns are of different thicknesses, so as to reduce the different current drive characteristics that are caused by the at least one oblique wall.

In some embodiments, the pillar is wider remote from the face compared to adjacent the face, and the repeating layer patterns are thicker remote from the face compared to adjacent the face. In some embodiments, the repeating layer patterns comprise repeating channel layer patterns of the string of serially connected flash memory cells, whereas the pillar comprises gates of the serially connected flash memory cells. In other embodiments, the repeating layer patterns comprise repeating gate patterns of the string serially connected flash memory cells, whereas the pillar comprises channels of the serially connected flash memory cells.

In still other embodiments, the repeating layer patterns comprise repeating patterns of an active layer and an insulating layer, and a ratio of thickness of a respective active layer and a width of a pillar adjacent the respective active layer is constant. Moreover, in some embodiments, the pillar may have a circular, ellipsoidal, regular polygonal or elongated polygonal cross-sectional shape, and includes a wall that extends at least in part oblique to the face.

In other embodiments, the series of repeating layer patterns in the series of serially connected flash memory cells increase in thickness from the first flash memory cell to the last flash memory cell. In other embodiments, the pillar has nonuniform cross-sectional area between the first and last flash memory cell, and the series of repeating layers are sufficiently different in thickness so as to reduce drive current variation among the string of serially connected flash memory cells to less than about 20%, and, in some embodiments, to less than about 5%, notwithstanding the nonuniform cross-sectional area of the pillar.

In still other embodiments, the repeating layer patterns comprise repeating gate electrode patterns of the string of serially connected flash memory cells, and the pillar comprises a channel region that extends through the repeating gate electrode patterns, that is of circular cross-section and that has an oblique sidewall, and a blocking insulating layer, a charge storage layer and a tunnel insulating layer between the channel regions and the repeating gate electrode patterns. The circular cross-section may increase with distance away from the face, and the thickness of the gate electrode patterns also may increase with distance away from the face.

In yet other embodiments, the series of repeating layer patterns include an opening therein that extends through the series of repeating layer patterns, and that include at least one oblique wall. The pillar may fill the opening. In other embodiments, the series of repeating layer patterns include an elongated opening therein that extends through the series of repeating layer patterns, and the pillar is a first pillar that extends along a first wall of the elongated opening, and that include at least one oblique wall. The device may further include a second pillar that extends along a second wall of the elongated opening that is opposite the first wall, and the second pillar may also include at least one oblique wall. In yet other embodiments, the pillar extends from a first wall of the elongated opening to a second wall of the elongated opening that is opposite the first wall, and includes at least one oblique wall. In still other embodiments, the pillar may extend onto the last flash memory cell in the string.

In still other embodiments, the string of serially connected flash memory cells comprises a plurality of groups of serially connected flash memory cells. In these embodiments, at least two of the series of repeating layer patterns in a given group of serially connected flash memory cells are of same thickness, whereas at least two of the series of repeating layer patterns in different groups of serially connected flash memory cells are of different thicknesses.

Selection transistors may also be added to the string of serially connected flash memory cells, according to other embodiments. In particular, a first selection transistor may be provided between the face and the first flash memory cell, and a second selection transistor may be provided on the last flash memory cell opposite the face. The first and second selection transistors may also comprise a layer pattern and the pillar may also extend therethrough. In some embodiments, the layer pattern of the first selection transistor may be of different thickness than the layer pattern of the first flash memory cell, and the layer pattern of the second selection transistor may be of different thickness than the layer pattern of the last flash memory cell. Moreover, in other embodiments, the layer pattern of the first selection transistor may be of different thickness than the layer pattern of the second selection transistor.

Embodiments of the invention have been described above primarily in connection with vertical NAND flash memory devices. However, other embodiments can provide vertical (three-dimensional) microelectronic devices other than vertical NAND flash memory devices. In these embodiments, a plurality of transistors are stacked on the face of the substrate, with a first transistor in the stack being adjacent the face and the last transistor in the stack being remote from the face. The plurality of transistors that are stacked on the face comprise a plurality of repeating layer patterns that are stacked on the face, and a pillar extends through the plurality of repeating layer patterns and includes at least one oblique wall. The at least one oblique wall causes the plurality of transistors that are stacked on the face to have different current drive characteristics. At least two of the plurality of repeating layer patterns are of different thicknesses, so as to reduce the different current drive characteristics that are caused by the at least one oblique wall. In some embodiments, the drive current variation among the plurality of transistors may be less than about 20%, whereas, in other embodiments, the variation in drive current may be less than 5%, notwithstanding the nonuniform cross-sectional area of the pillar.

In some embodiments, the pillar is wider remote from the face compared to adjacent the face, and the repeating layer patterns are thicker remote from the face compared to adjacent the face. In some embodiments, the repeating layer patterns comprise repeating channel layer patterns of the plurality of transistors that are stacked on the face, whereas the pillar comprises gates of the plurality of transistors that are stacked on the face. In other embodiments, the repeating layer patterns comprise repeating gate patterns of the plurality of transistors that are stacked on the face, whereas the pillar comprises channels of the plurality of transistors that are stacked on the face. In still other embodiments, the repeating layer patterns comprise repeating patterns of an active layer and an insulating layer, and a ratio of thickness of a respective active layer and a width of the pillar adjacent the respective active layer is constant.

In still other embodiments, the pillar has a circular, ellipsoidal, regular polygonal or elongated polygonal cross-sectional shape, and includes a wall that extends, at least in part, oblique to the face. In other embodiments, the series of repeating layer patterns in the plurality of transistors that are stacked on the face increase in thickness from the first transistor to the last transistor. In still other embodiments, the plurality of transistors comprise a plurality of groups of transistors, wherein at least two of the series of repeating layer patterns in a given group are of the same thickness, whereas at least two of the series of repeating layer patterns in different groups are of different thicknesses.

Other embodiments provide methods of fabricating a vertical NAND flash memory device. According to these embodiments, a plurality of repeating layer patterns are stacked on a face of the substrate, wherein at least two of the repeating layer patterns have different thicknesses. A nonuniform width pillar is formed that extends across the plurality of repeating layers, such that the plurality of repeating layers and the nonuniform width pillar extending thereacross define a string of serially connected flash memory cells of uniform current drive capability. For example, variations of current drive capabilities of less than about 20% or less than about 5% may be provided.

In some embodiments, the nonuniform width pillar may be fabricated by etching through the plurality of repeating layer patterns at an oblique angle to create a nonuniform width hole that extends through the plurality of repeating layer patterns, and filling the nonuniform width hole to produce the nonuniform width pillar. In other embodiments, the plurality of repeating layer patterns are etched to define an opening therein, a layer is formed in the opening, and the layer in the opening is etched at an oblique angle to create the nonuniform width pillar. Various other fabrication embodiments may be provided. Moreover, analogous methods may be provided for fabricating vertical microelectronic devices other than NAND flash memory devices.

BRIEF DESCRIPTION OF THE DRAWINGS

FIG. 8b is an enlarged perspective view of a portion of FIG. 8a.

DETAILED DESCRIPTION

Figure 1:
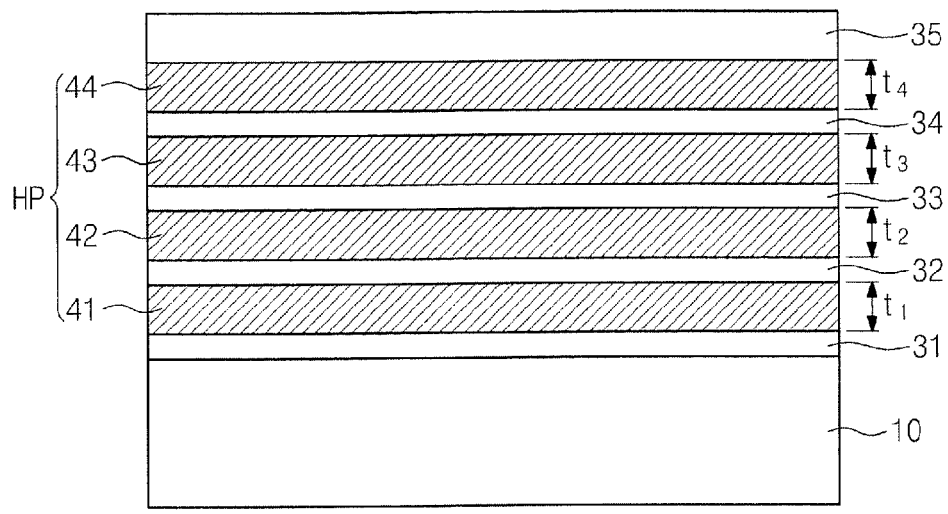
FIGS. 1-3 are cross-sectional views of flash memory devices according to various embodiments, during intermediate fabrication steps according to various embodiments.

The present invention now will be described more fully hereinafter with reference to the accompanying drawings, in which various embodiments are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (or variations thereof), it can be directly on or extend directly onto the other element or intervening elements may also be present. In contrast, when an element is referred to as being "directly on" or extending "directly onto" another element (or variations thereof), there are no intervening elements present. It will also be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below. However, as used herein, and as conventionally used, the "vertical" direction is generally orthogonal to the face of the substrate regardless of its orientation, whereas the "horizontal" direction is generally parallel to (extending along) the face of the substrate.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Some embodiments of the present invention may arise from recognition that as high density vertical NAND flash memory devices are fabricated, large numbers of flash memory cells, such as up to ten or more flash memory cells, may be stacked on a substrate. In order to provide a three-dimensional structure, a pillar of one kind or another, generally is formed that extends through the stacked flash memory cells. Conventionally, it is assumed that this pillar is orthogonal to the substrate, i.e., is a vertical pillar. However, in reality, it may be difficult to maintain orthogonal walls when providing high aspect ratio pillars that extend through a large number of stacked flash memory cells. Due to the large number of stacked cells, a small deviation from orthogonality, such as an only 1° difference, may still provide a wide variation in performance, such as a 2× variation in performance, between the first and last flash memory cells in the string. Embodiments of the invention can vary the thicknesses of at least two of the layer patterns that comprise a transistor, so as to at least partially compensate for the difference in performance that is caused by the deviation from orthogonality. By varying the thickness of the layers that comprise the various flash memory cells, deviations in drive current can be reduced to less than 20% in some embodiments and less than 5% in other embodiments.

Figure 2:
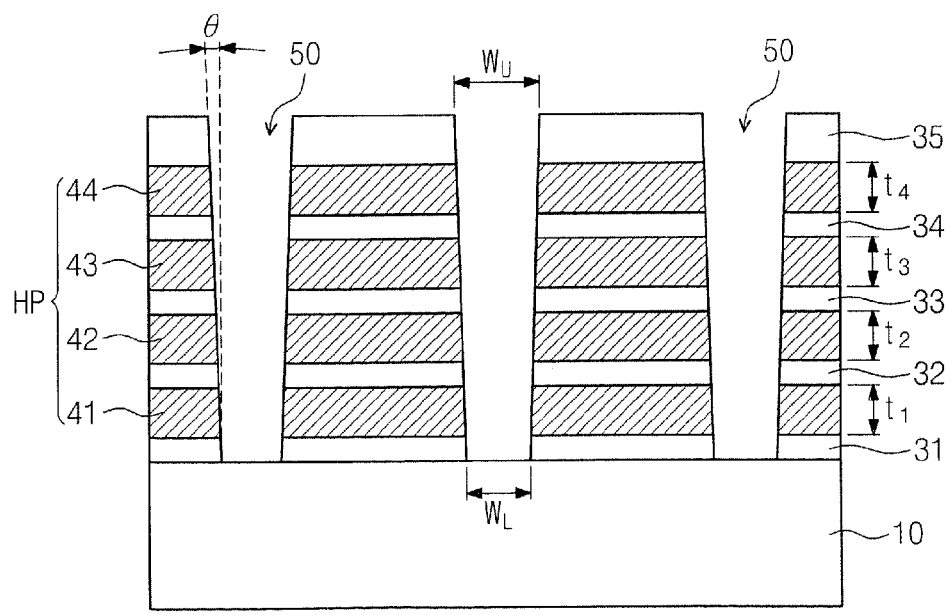
Figure 3:
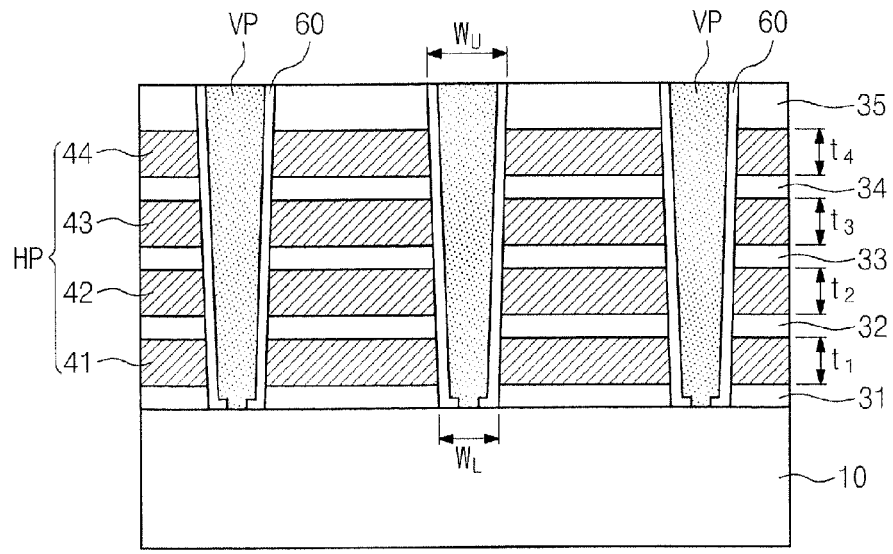

FIGS. 1-3 are cross-sectional views of vertical NAND flash memory devices according to various embodiments, during intermediate fabrication steps according to various embodiments. Referring now to FIG. 1, a series of repeating layer patterns is stacked on a face of a substrate 10. As used herein, a substrate may include a single element and/or compound semiconductor substrate and/or any other single layer or multilayer microelectronic substrate. The repeating layer patterns include a plurality of insulating layers 31, 32, 33, 34 and 35, and a plurality of active layers, also referred to as horizontal thin layer patterns (HP) 41, 42, 43 and 44 having a respective thickness $t_1$-$t_4$. It will be understood that only four repeating layer patterns are illustrated for the sake of simplicity. However, fewer or more than four patterns may be provided according to other embodiments. In fact, as was already noted, up to ten or more repeating layer patterns may be provided in various embodiments.

Referring now to FIG. 2, an opening 50 is formed in the exposed surface of the device by a mask pattern, through the insulating layers 31-35 and through the thin layers 41-44 using, for example, an anisotropic etch. The opening 50 may have various cross-sectional configurations including a circular, ellipsoidal, regular polygonal or elongated polygonal cross-sectional shape. The circular, ellipsoidal or regular polygonal shape may also be referred to as a "hole" type shape, whereas an elongated polygonal cross-sectional shape also may be referred to as a "line" type shape.

Still referring to FIG. 2, although it is generally desired for the opening 50 to have vertical sidewalls that are orthogonal to the substrate face, real world processing conditions may cause an oblique or sloped sidewall, having a slope θ, as illustrated in FIG. 2. This slope may cause the lower width $W_L$ to be narrower than the upper width $W_U$. Thus, the width of the opening 50 varies based upon a distance from the substrate 10 and the slope θ.

It will be understood that, in other embodiments, a negative slope may be provided, such that the lower width $W_L$ is wider than the upper width $W_U$ and/or a nonuniform slope may be provided as a function of distance due to, for example, properties of the process that is used to form the opening 50.

Referring now to FIG. 3, a gate insulating layer 60 and a vertical pattern VP, also referred to as a "pillar", are sequentially formed in the opening 50, and, in some embodiments, fill the opening 50.

Still referring to FIG. 3, if the horizontal thin layers 41-44 all have the same thickness, i.e., $t_1$=$t_2$=$t_3$=$t_4$, then the facing area between the horizontal thin layers 41-44 and the vertical pattern VP may differ according to the height h from the substrate. In some embodiments, the horizontal thin layers 41-44 are used as a gate electrode of a flash memory cell transistor, and the vertical patterns are used as the channel regions of the memory transistors. Conversely, in other embodiments, the horizontal thin layers 41-44 are used as a channel region of the flash memory cell transistors, and the vertical patterns VP are used as the gate electrode of the flash memory cell transistors. In either embodiment, the thickness of the horizontal thin layers 41-44 and the width of the vertical pattern VP adjacent thereto, define an aspect ratio of the channel region of the memory transistor. As is well known, drain current or drive current ($I_d$) of a transistor is proportional to the channel width W and inversely proportional to the channel length L according to following equation:

$$I_d = \alpha W/L \; (V_G - V_T) V_D, \quad (1)$$

where α is a proportionality constant, $V_G$ is the gate voltage, $V_T$ is the threshold voltage and $V_D$ is the drain voltage. Thus, if the horizontal thin layers 41-44 have the same thickness, the memory transistors that are formed at the different heights will have different current characteristics due to the different widths of the vertical patterns that are caused by the at least one oblique wall thereof. Thus, when the horizontal thin layers 41-44 are gate electrodes and the vertical patterns are the channel regions, the channel width will vary as a function of height. Alternatively, when the horizontal thin layers are used as channels and the vertical patterns are used as gates, the current characteristics will vary due to the channel length difference as a function of height.

In order to reduce or eliminate this variation, according to various embodiments at least two of the horizontal layers 41-44 have different thicknesses from each other.

Figure 4:
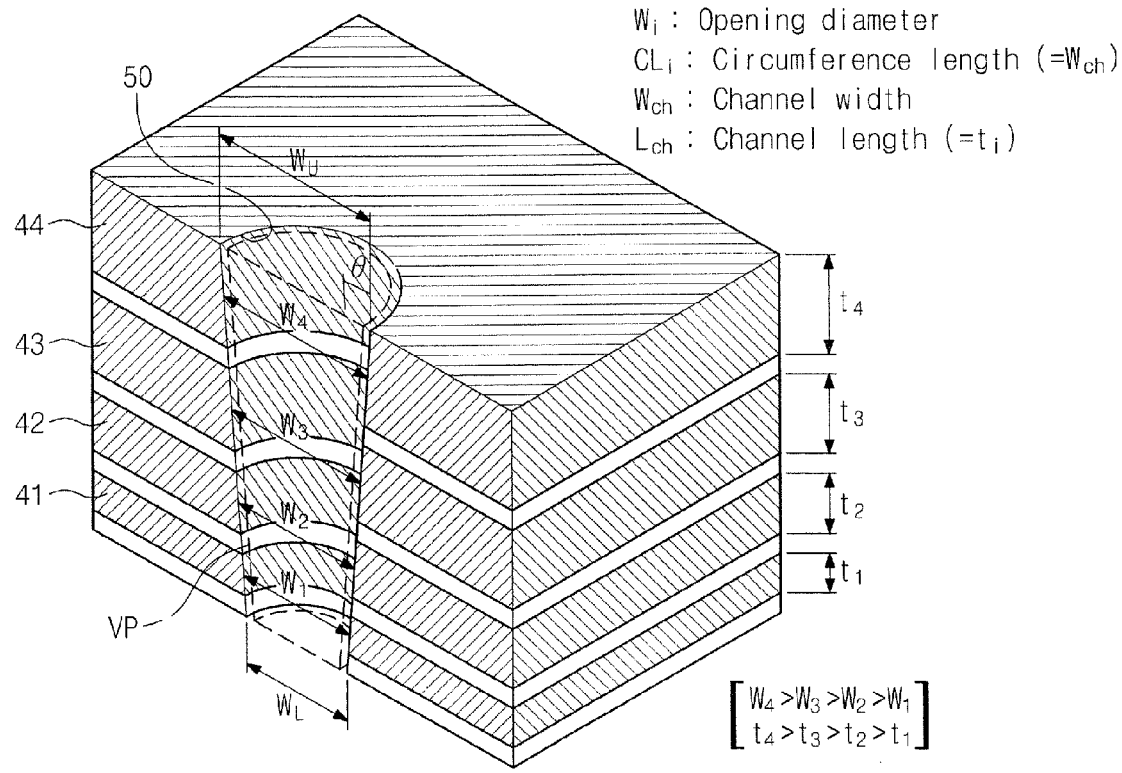
FIG. 4 is a perspective view of FIG. 2.
Figure 5:
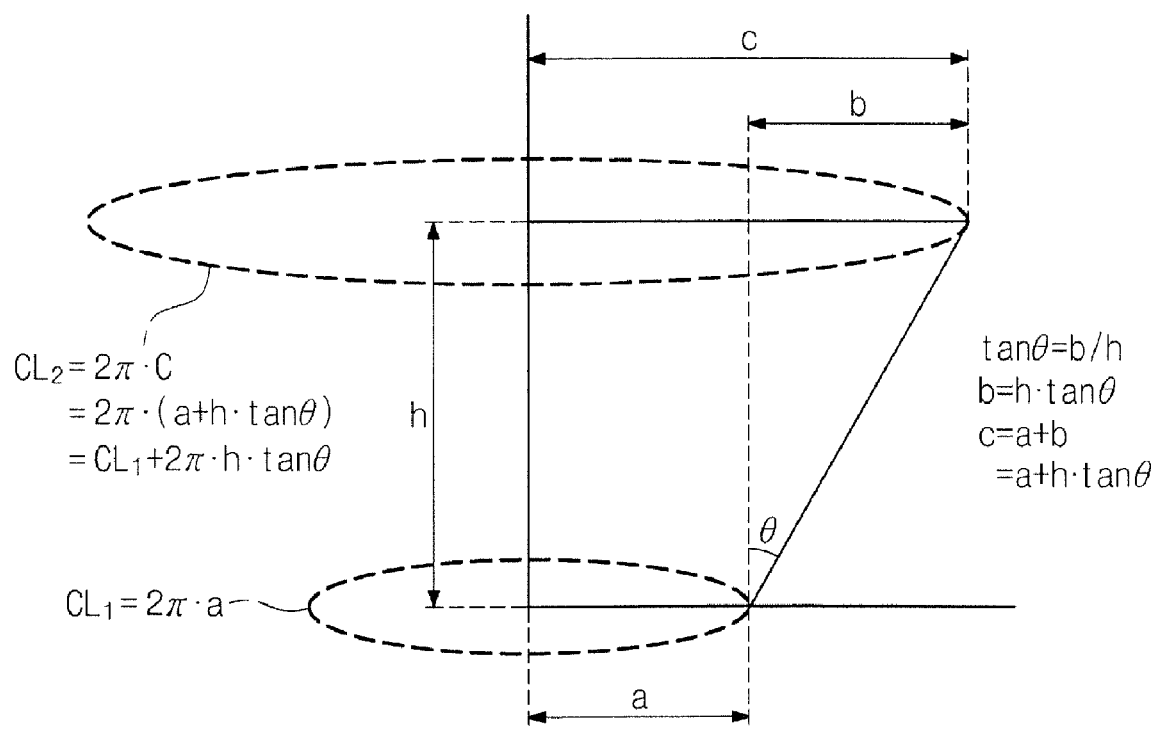
FIG. 5 is a geometrical analysis of FIG. 4.

FIG. 4 is a perspective view illustrating details of the formation of an opening 50 with oblique walls. Moreover, FIG. 5 illustrates a geometrical analysis of the variation in the width of the opening. Referring to FIGS. 4 and 5, $W_i$(i=1-4) indicates a diameter of an opening, whereas $CL_i$(i=1-4) indicates a length of a circumference, $W_{ch}$ indicates a channel width and $L_{ch}$ indicates a channel length. It will be understood that the channel length may correspond to a thickness Ti(i=1-4) and the channel width may correspond to the circumference length (CL).

As shown in FIG. 5, h is a height difference between two planes that cross the opening 50, a is a radius of the opening 50 crossing the lower plane and a+h*tan θ is the radius c of the opening 50 crossing the upper plane. $CL_1$ is the circumference of the opening 50 crossing the lower plane and is equal to 2πa, whereas $CL_2$ is the circumference of the opening at the upper plane, which is equal to 2πc or CL1=2π*h*tan θ.

Thus, in the hole-type opening of FIGS. 4 and 5, the width $W_i$, i.e., the diameter of the opening 50, increases as a function of distance from the substrate. Horizontal thin layers 41-44 may be used as a gate electrode of the transistor, and the vertical patterns VP may be used as a channel region. Because the cross-section of the opening is a circle, and the circumference $CL_i = \pi W_i$, the channel width of the transistor ($W_{ch,i}$) is proportional to the circumference length ($CL_i$) of the opening 50, and the channel length ($L_{ch,i}$) of the transistor is proportional to the thickness ($t_i$) of the horizontal thin layer. Thus, according to some embodiments, the thickness $t_1$-$t_4$ of the horizontal thin layers 41-44 may be selected to equalize an interlayer thickness ratio ($t_{i+1}$/ti) of the horizontal thin layers with an interlayer circumference ratio ($CL_{i+1}/CL_i$) of the opening 50, according to the following equation:

$$T_{i+1}/t_i = CL_{i+1}/CL_i \Rightarrow CL_i/T_i = CL_{i+1}/T_{i+1}. \quad (2)$$

If the thickness of the horizontal thin layer is selected to meet Equation 2, the aspect ratio $W_{ch,i}/L_{ch,i}$ of the channel region may be made equal to each other regardless of the height of the memory transistor. That is:

$$W_{ch,i}/L_{ch,i} = CL_i/t_i = CL_1 + 1/T_{i+1}. \quad (3)$$

Per Equation 1, the current characteristic of the memory transistor may be equalized regardless of the height of the transistor.

In another example, the width $W_i$, i.e., the diameter of the opening 50, may narrow as a function of distance from the substrate, so that the angle θ is a negative angle, and $W_L$ is greater than the upper width $W_U$. Again, according to some embodiments, the thickness of the horizontal thin layers may be selected to meet Equation 2, so that the current driving characteristics of the transistors may be equalized.

Accordingly, in some embodiments, at least two of the series of repeating layer patterns in the string of serially connected flash memory cells are of different thicknesses. In other embodiments, the pillar is wider remote from the face compared to adjacent the face, and the repeating layer patterns are thicker remote from the face compared to adjacent the face. In yet other embodiments, the repeating layer patterns comprise repeating patterns of an active layer (e.g., a channel layer or a gate layer) and an insulating layer, and the ratio of thickness of a respective active layer and a width of the pillar adjacent the respective active layer is substantially constant. In some embodiments, the current drive characteristics of the stacked transistors may be equalized to within about 20% and, in other embodiments, to within about 5% by controlling the thicknesses of the thin layers 41-44. Accordingly, in some embodiments, the series of repeating layer patterns increases in thickness from the first flash memory cell to the last flash memory cell.

In other embodiments, as will be illustrated, for example, in FIGS. 21-23 below, the horizontal thin layers 41-44 may comprise a semiconductor material that is used as a channel region of the transistor, and the vertical patterns (VP) may comprise a conductive material that may be used as a gate electrode. In this case, the width $W_i$ or half the circumference length of the opening, may define the channel length of the transistor. As depicted in FIG. 4 (or in FIG. 23 as described below), when the width of the opening increases as a function of distance from the substrate 10, the channel length of the transistor may increase as a function of distance from the substrate 10. In order to allow the transistors of these embodiments to meet Equation 3, the thin layers 41-44 can be formed at a thickness to meet Equation 2. Again, in these embodiments, the interlayer fluctuation rate in the aspect ratio or the current drive characteristics of the transistor may be within about 20% and, in some embodiments, within about 5%, by controlling the thickness of the thin layers 41-44.

In embodiments that have been described above, the series of repeating layer patterns include an opening that extends through the series of repeating layer patterns and that includes at least one oblique wall, and the pillar fills the opening. However, in other embodiments that will be described below in connection with FIGS. 6a and 6b, the series of repeating layer patterns includes an elongated opening therein that extends through the series of repeating layer patterns. In embodiments of FIG. 6a, the pillar extends from a first wall of the elongated opening to a second wall of the elongated opening that is opposite the first wall, and includes at least one oblique wall. Moreover, in embodiments of FIG. 6b, the pillar is a first pillar that extends along the first wall of the elongated opening and that includes at least one oblique wall, and the device further includes a second pillar that extends along a second wall of the elongated opening that is opposite the first wall, and also includes at least one oblique wall. These line type gate structures will now be described.

Figure 6A:
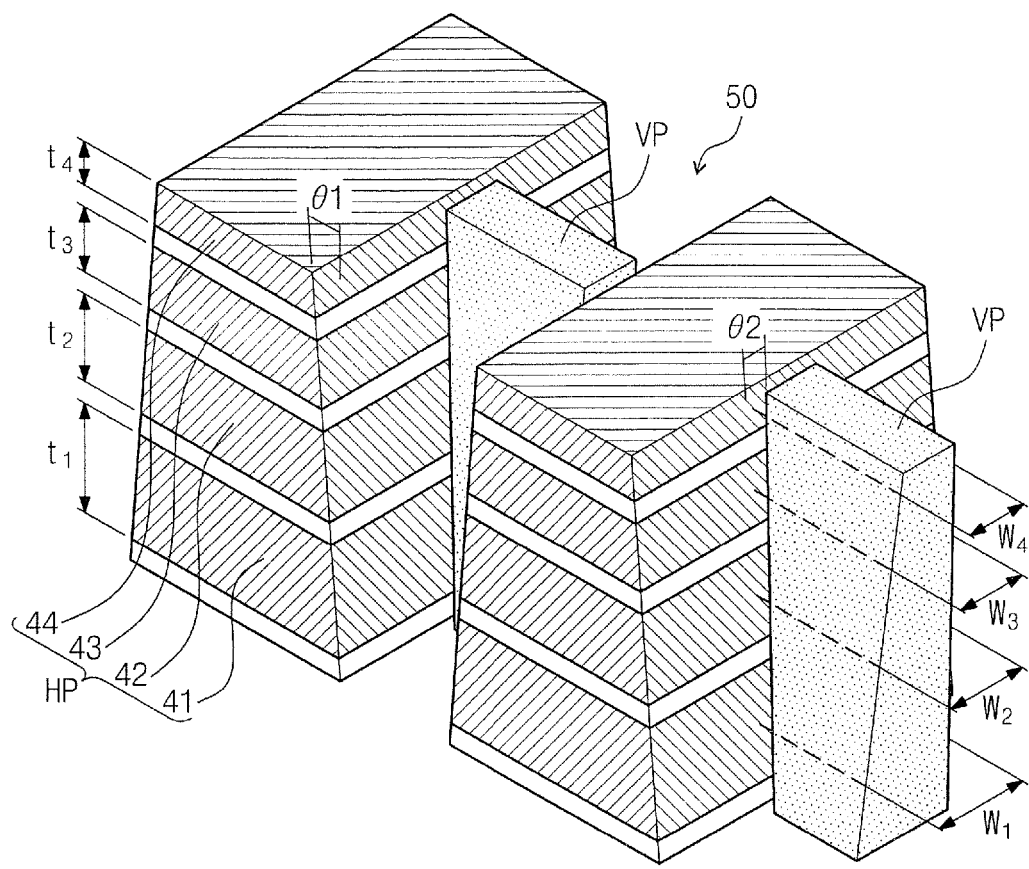
FIGS. 6a and 6b are perspective views of flash memory devices according to other embodiments.
Figure 6B:
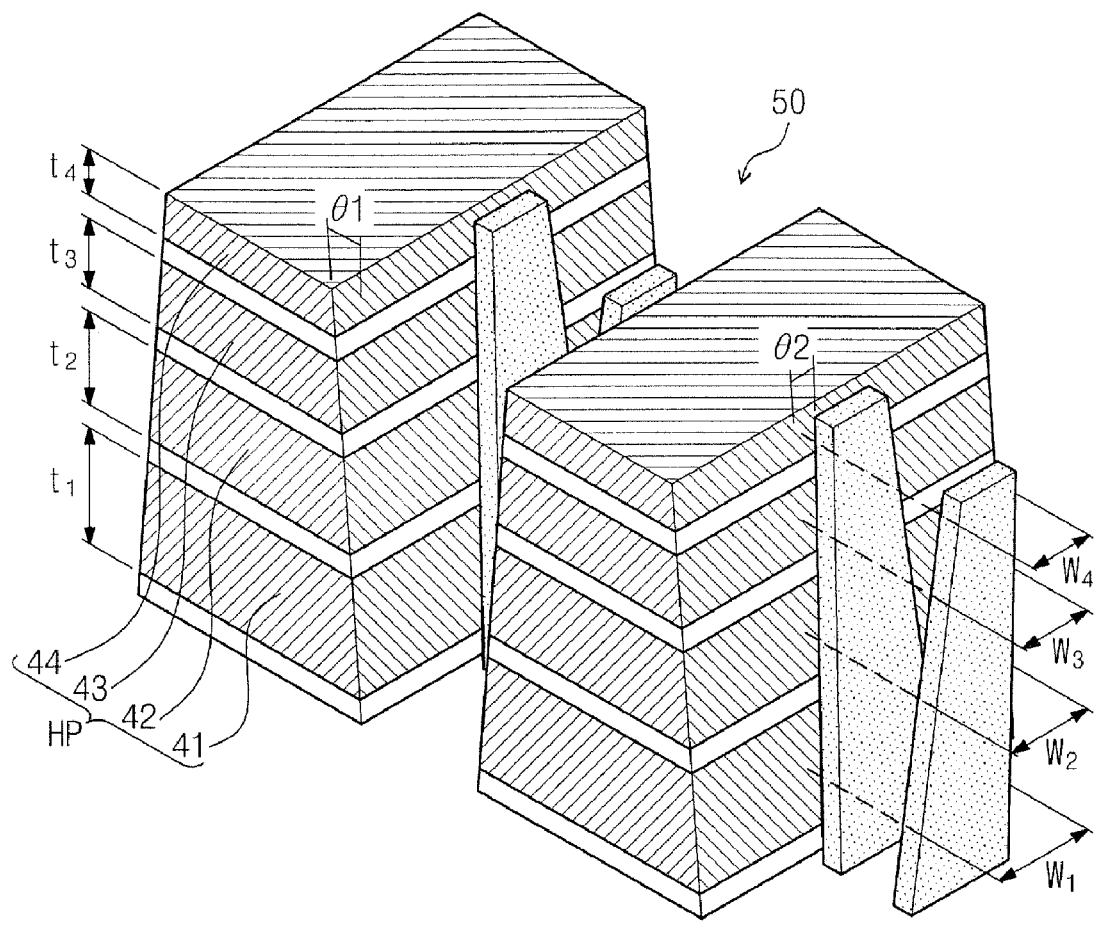

In particular, FIGS. 6a-6b illustrate flash memory devices that include line type gate structures according to other embodiments of the present invention. As shown in FIGS. 6a and 6b, the opening 50 may be formed in a line type (elongated) shape, such that its length is relatively longer than its width. In this case, the horizontal thin layers 41-44 defined by this line type opening 50 may also be formed in the line type shape. The vertical patterns (VP) or pillar of FIG. 6a can be formed by filling an epitaxial layer in the opening 50, and the VP of FIG. 6b can be conformally formed in the opening using techniques that will be described below in connection with FIG. 9. By etching the horizontal thin layers 41-44 to form the HP, the sidewall of the thin layers or the sidewall of the opening 50 includes a first tilt angle $θ_1$ that is vertical, i.e., perpendicular to the face of the substrate.

Still referring to FIGS. 6a and 6b, a plurality of the vertical patterns VP of FIGS. 6a and 6b are arranged in one opening 50 facing toward the sidewall of the thin layers 41-44. The vertical pattern VP that is used as an active region is horizontally separated for electrical isolation of each device by patterning the thin layers 41-44 in the line shape, and patterning the material in the direction across the opening 50 to form each vertical pattern that is separated electrically in the opening 50, as shown in FIG. 6b. In this case, one sidewall of the vertical pattern VP includes at a second tilt angle $θ_2$ relative to the orthogonal direction, so that the width $W_i$ of the sidewall of the vertical pattern VP facing the thin layers 41-44 decreases as a function of distance from the substrate.

Because the width $W_i$ of the pattern VP facing the horizontal thin layers 41-44 is determined by the second tilt angle $θ_2$, the aspect ratio of the channel region of the transistor is determined by the second title angle $θ_2$. Thus, if each of the thin layers 41-44 is formed at the same thickness, the interlayer uniformity of the current characteristic of the transistor may deteriorate.

In contrast, according to various embodiments, the thickness $t_i$ of the thin layers 41-44 may be selected to meet Equation 4, so that the interlayer uniformity in the current characteristic of the transistor may be improved:

$$t_{i+1}/t_i = Wi+1/W_i \rightarrow W_{ch,i}/L_{ch,i} = W_i/t_i = W_{i+1}/t_{i+1} \qquad (4)$$

In Equation 4, the channel width $W_{ch,i}$ of the transistor is proportional to the width $W_i$ of the VP and the channel length ($L_{ch,i}$) of the transistor is proportional to the thickness $t_i$ of the horizontal thin layer.

It will be understood that embodiments of the invention have heretofore been described in connection with a constant (linear) increase or decrease in width of the pillar as a function of distance, i.e., a constant angle θ. However, in other embodiments, characteristics of etchings and/or other considerations in the design of a flash memory device may cause a nonuniform change in width per unit distance from the substrate. Thus, for example, the opening may have a winding (i.e., increasing, then decreasing, then increasing, then decreasing, etc.), barrel-shaped (wider at the middle than at either end), streamlined (bottle shaped) or other nonlinear change in width as a function of difference. Yet, the thicknesses of the repeating layer patterns can be adjusted relative to one another according to various embodiments, to accommodate any of these nonlinear shapes. Step-like (abrupt) changes in shape also may be accommodated.

Figure 7:
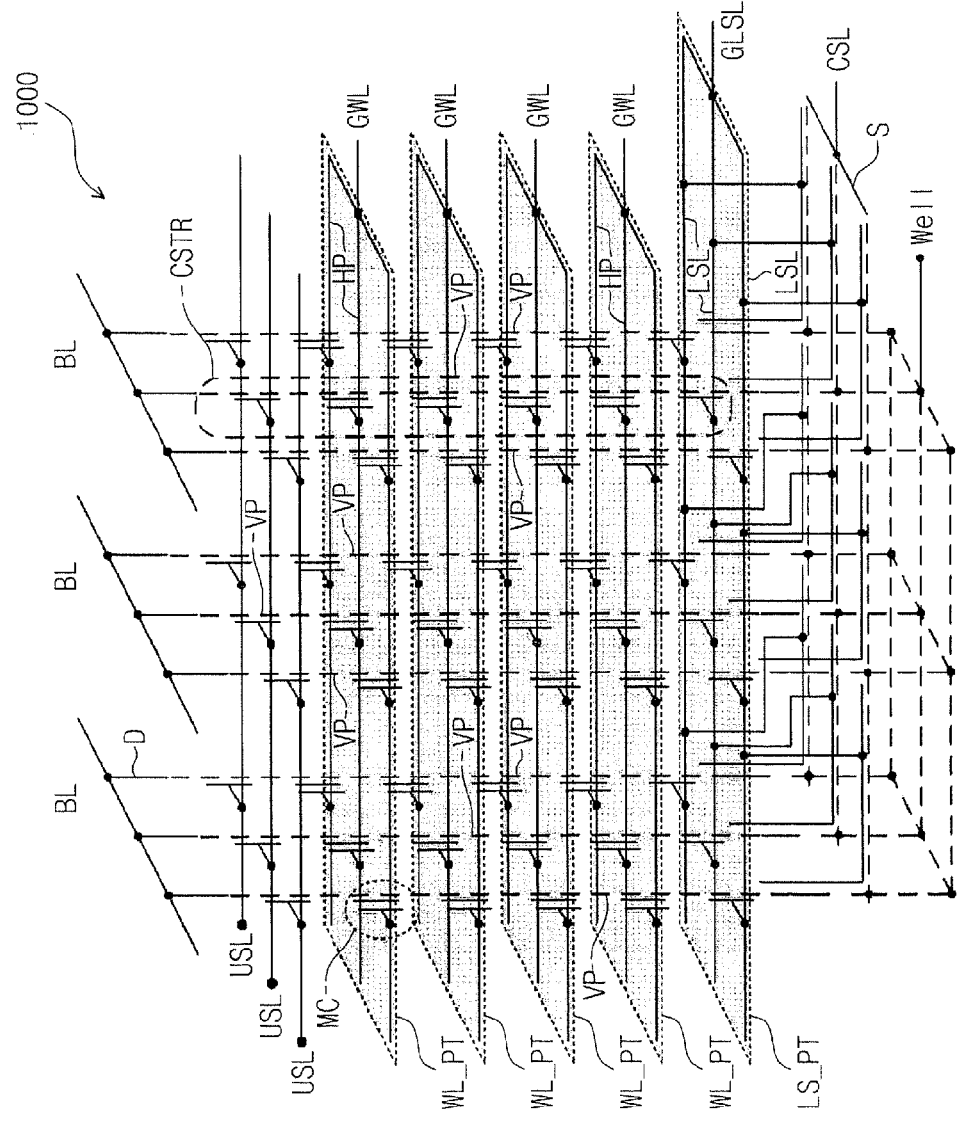
FIG. 7 is a circuit diagram of flash memory devices according to still other embodiments.

FIG. 7 is a circuit diagram showing a NAND flash memory 1000 according to various embodiments that may correspond to embodiments of FIG. 4. A listing of terms is also included. A memory cell MC is provided at intersection points where the word line plate WL_PT or the horizontal pattern HP and the vertical pattern VP intersect each other. One cell string CSTR is defined by a plurality of memory cells MCs in one vertical pattern VP and a gate insulation layer comprising a charge storage layer is provided therebetween. One end of each of the vertical patterns VP is connected to a well region and a respective other end is connected to a bit line BL. The upper selection line USL between the BL and WL_PT defines a MOS capacitor with the vertical pattern VP. The lower selection line LSL or LS_PT between the well region and WL_PT defines a MOS capacitor with the vertical pattern VP and/or the well region.

Figure 8A:
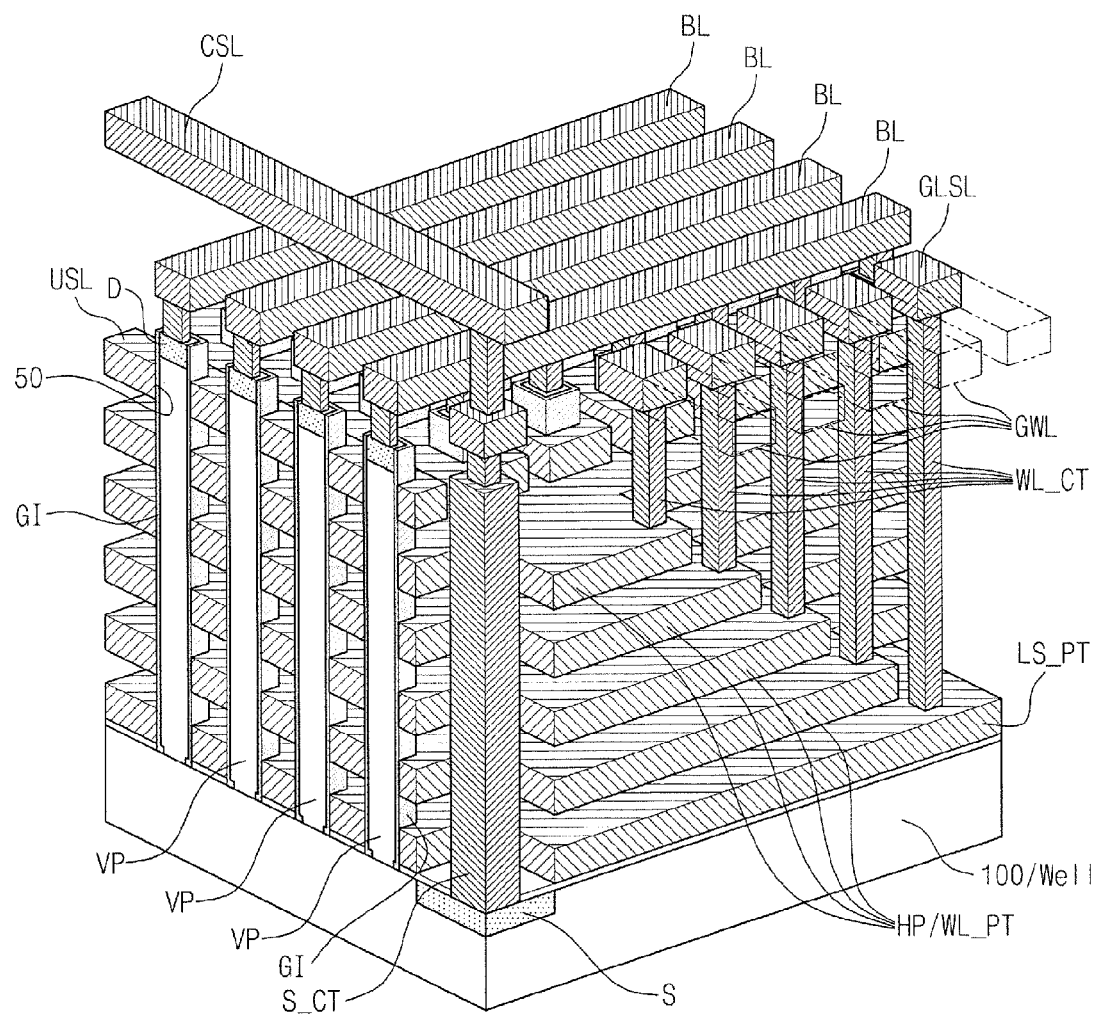
FIG. 8a is a perspective view of the circuit diagram of FIG. 7.

FIG. 8a is a perspective view of a circuit of FIG. 7. On a substrate 100, a plurality of gate conductive layers comprising the lower selection line LSL, the upper selection line USL and the word line plate WL_PT therebetween are sequentially stacked, separated from each other. Each of the gate layers has an opening 50 that is arranged in two dimensions. The USL of the line or stripe shape is formed across the BL. The HP and the LSL may have a plate shape. The source region S may be formed in the entire surface of the substrate 100 by N+ impurity implantation.

Still referring to FIG. 8a, the VP is arranged in the opening 50 and comprises a body part that is adjacent to the well region and a drain region adjacent the USL. The body part may have the same conductivity as the well region and the drain region may have a different conductivity from the well region. In these embodiments, the opening 50 has an upper width Wu that is wider than the lower width $W_L$. For example, W4>W3>W2>W1. In this case, the horizontal thin layer HP used as the gate electrode of the memory transistor can be formed in a thickness to meet Equation 2 to allow increased interlayer uniformity of the current characteristic of transistor. For example, t1<t2<t3<t4, as shown in FIG. 8b.

Because the ground selection transistor and the string selection transistor are generally designed to have a current drive characteristic that is different from the memory cell transistor, the thickness of the upper and lower selection lines (USL, LSL) may differ from the thickness of the horizontal thin layer HP. In some embodiments, the thickness of the upper and lower selection lines USL, LSL may be thicker than a minimum thickness of the thin layer HP used as the gate electrode of the memory cell transistor. Thus, in some embodiments, a first selection transistor is provided between the face and the flash memory cell in the string, and a second selection transistor may be provided on the last flash memory cell in the string, opposite the face. The first and second selection transistors may both comprise a layer pattern and the pillar may extend therethrough. In some embodiments, the layer pattern of the first selection transistor is of different thickness than the layer pattern of the first flash memory cell, and the layer pattern of the second selection transistor is of different thickness than the layer pattern of the last flash memory cell. Moreover, in other embodiments, the layer pattern of the first selection transistor may be of different thickness than the layer pattern of the second selection transistor.

Figure 8B:
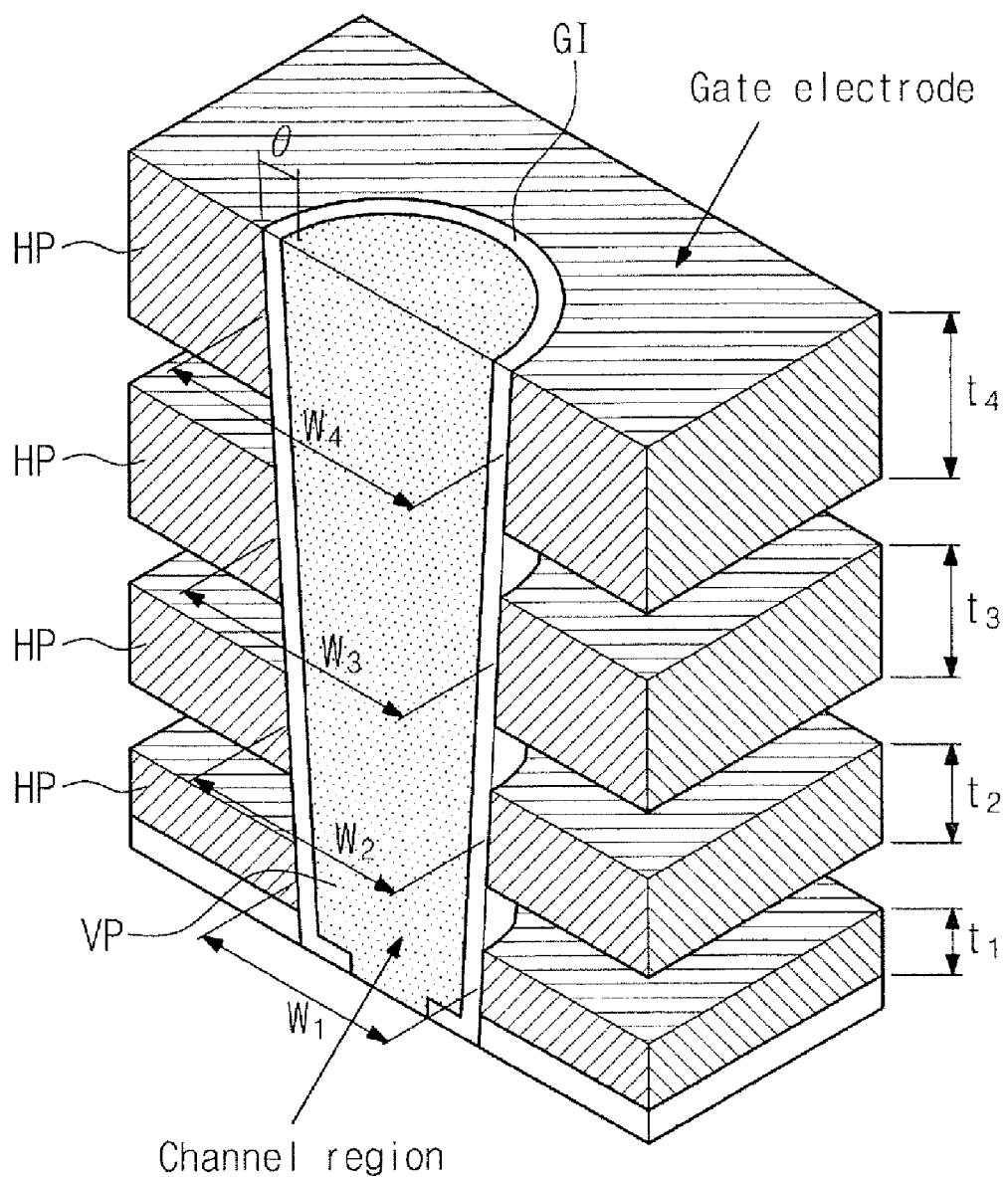

Still referring to FIGS. 8a and 8b, the gate insulation layer GI comprises a blocking insulation layer, a charge storage layer and a tunneling insulation layer that are provided between the VP and the WL_PT. The gate insulation layer may also extend between the LS_PT and the VP or between the USL and VP. An inversion region may be formed in a surface of VP facing to the LSL, $W_L$, USL by a voltage applied to the LSL, WL, USL. Other gate insulation layer structures may be provided in other embodiments. In some embodiments, a gap between the gate conductive layers may be shorter than a maximum width of the inversion region to form an electrical connection path by piling up the inversion regions on each other. Moreover, a portion of the VP adjacent to a space of the gate conductive layers may be inverted by a fringe field due to a voltage applied to the gate conductive layers. The cell string CSTR comprises memory cell transistors connected in series. The gate conductive layer is used as the gate electrode of the memory cell transistor, and the inversion region is used as the source and drain regions.

FIGS. 9-13 are perspective views of other embodiments in which the formation method of the cell array may be different. In particular, elongated (line-type) embodiments are illustrated.

Figure 9:
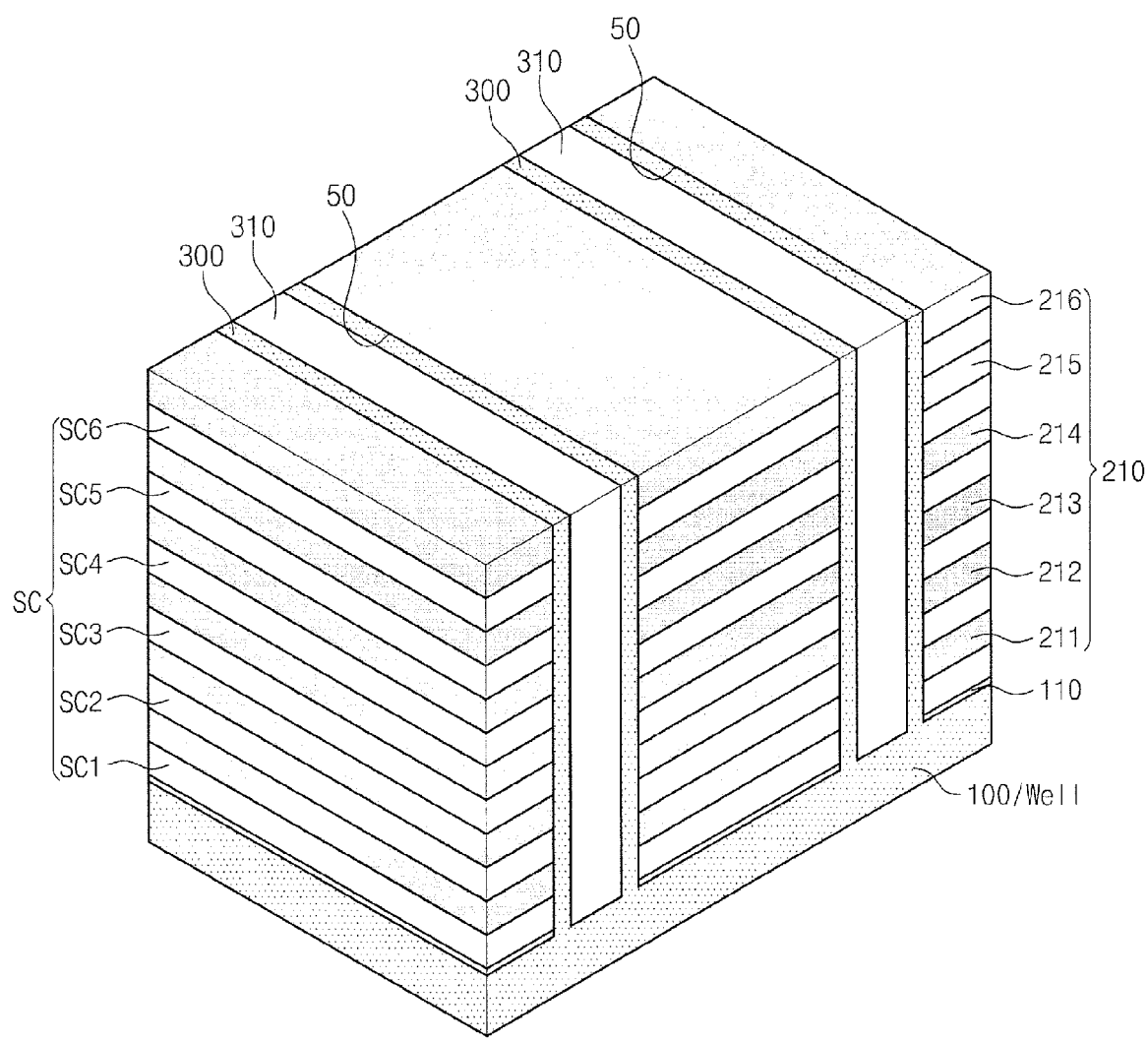
FIGS. 9-13 are perspective views of flash memory devices according to yet other embodiments, during intermediate fabrication steps according to yet other embodiments.

Referring to FIG. 9, on a substrate 100 having a buffer layer 110, a sacrificial layer structure SC comprising a plurality of the sacrificial layers SC1, SC2, SC3 . . . and a gate interlayer dielectric layer structure 210 comprising a plurality of the gate interlayer dielectric layers 211-216 are formed in turn. The opening 50 of a line type or a stripe type, having different widths as a function of the distance from the substrate 100, is formed exposing the top of the substrate 100 by patterning the sacrificial layer structure SC and the gate interlayer dielectric layer structure 210. A semiconductor layer 300 is conformally formed on the sidewall of the opening 50. An insulating layer 310 fills the opening 50. In alternative embodiments, using an epitaxial technology, the opening 50 can be filled by the semiconductor layer 300, as was shown in FIG. 6a. The source region S may be formed in the entire surface of the substrate 100 by N+ impurity implantation.

Figure 10:
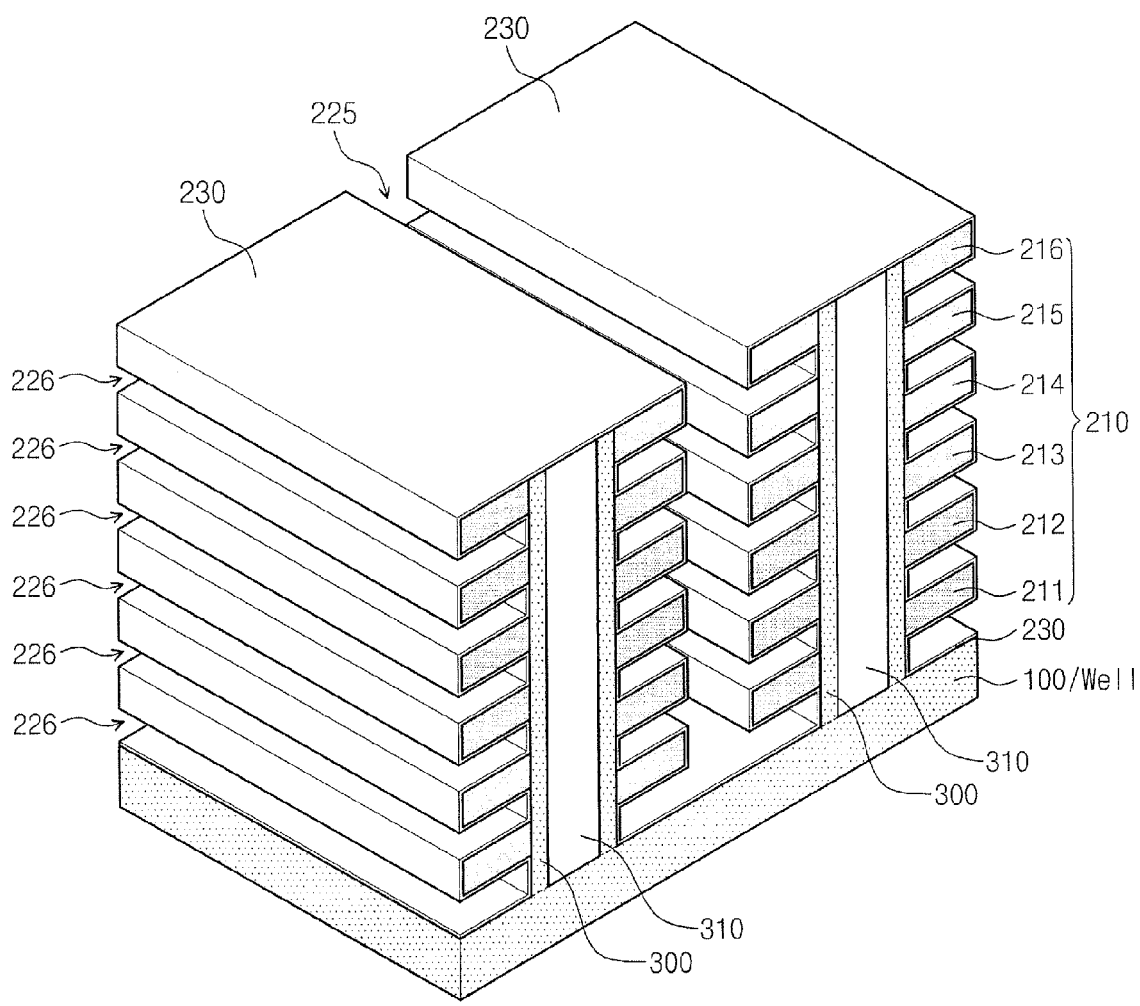

Referring now to FIG. 10, a preliminary gate separation region 225 is formed to expose the top of the buffer layer 110 or the substrate 100 between the openings 50 by patterning the sacrificial layer structure SC and the gate interlayer dielectric layer structure 210. The exposed sacrificial layers SC1-SC6 are removed, forming gate regions 226 that partially expose the sidewall of the semiconductor layer 300. During removal of the sacrificial layers SC1-SC6, the exposed buffer layer 110 may be also removed. A gate insulation layer 230 comprising a blocking layer, charge storage layer and a tunneling insulation layer is conformally formed on the resultant structure including the sidewall of the semiconductor layer 300. Other gate insulation layer structures may be provided in other embodiments.

Figure 11:
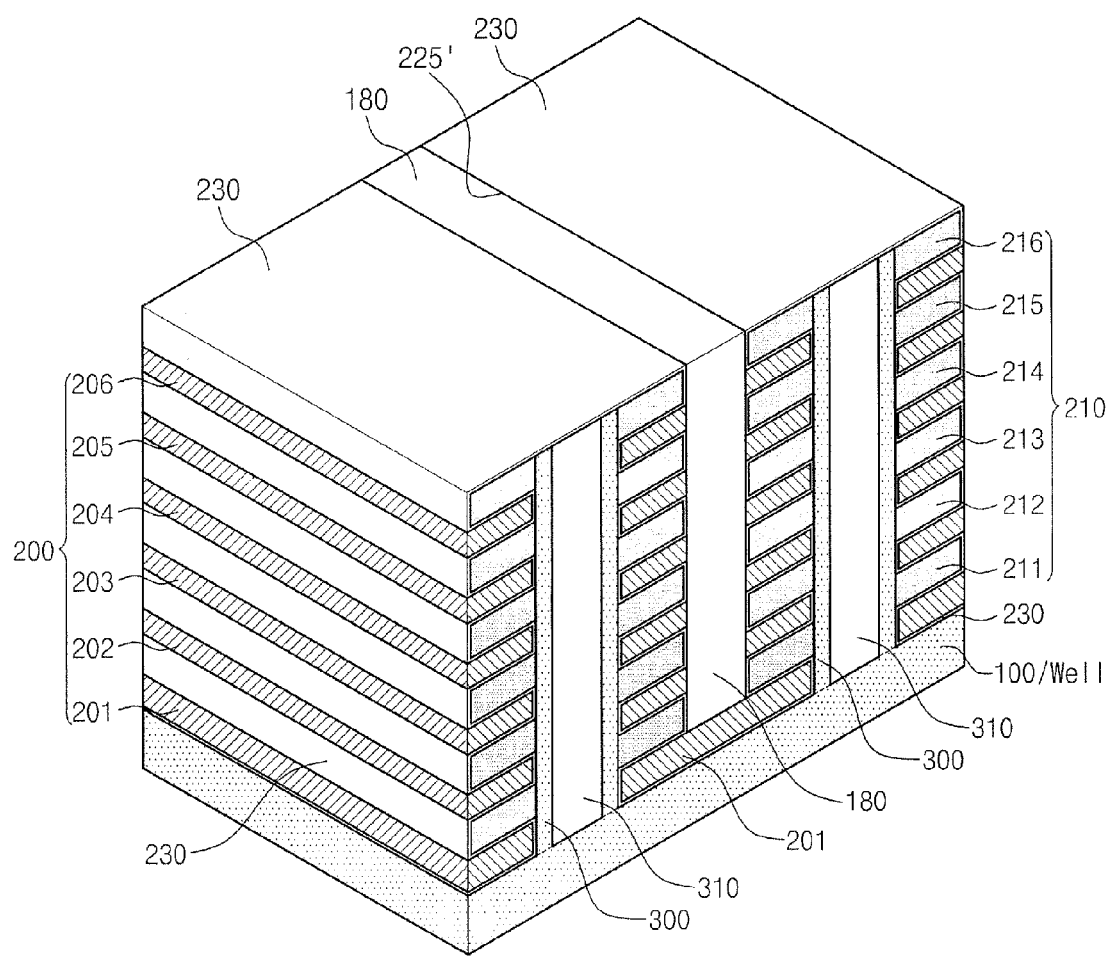

Referring now to FIG. 11, a gate structure 200 comprising gate layers 201-206 that are electrically separated each other, acting as the HP, is formed in the gate regions 226. In particular, a conductive gap-fill layer is filled in the preliminary gate separation region 225 and the gate regions 226. Then, the conductive gap-fill layer is anisotropically etched using the topmost gate interlayer dielectric layer 216 or the gate dielectric layer 230 as an etch mask, so that a gate separation region 225' may be formed exposing the sidewall of the conductive gap-fill layer being separated vertically. A gap-fill insulating layer 180 is filled in the gate separation region 225'.

Figure 12:
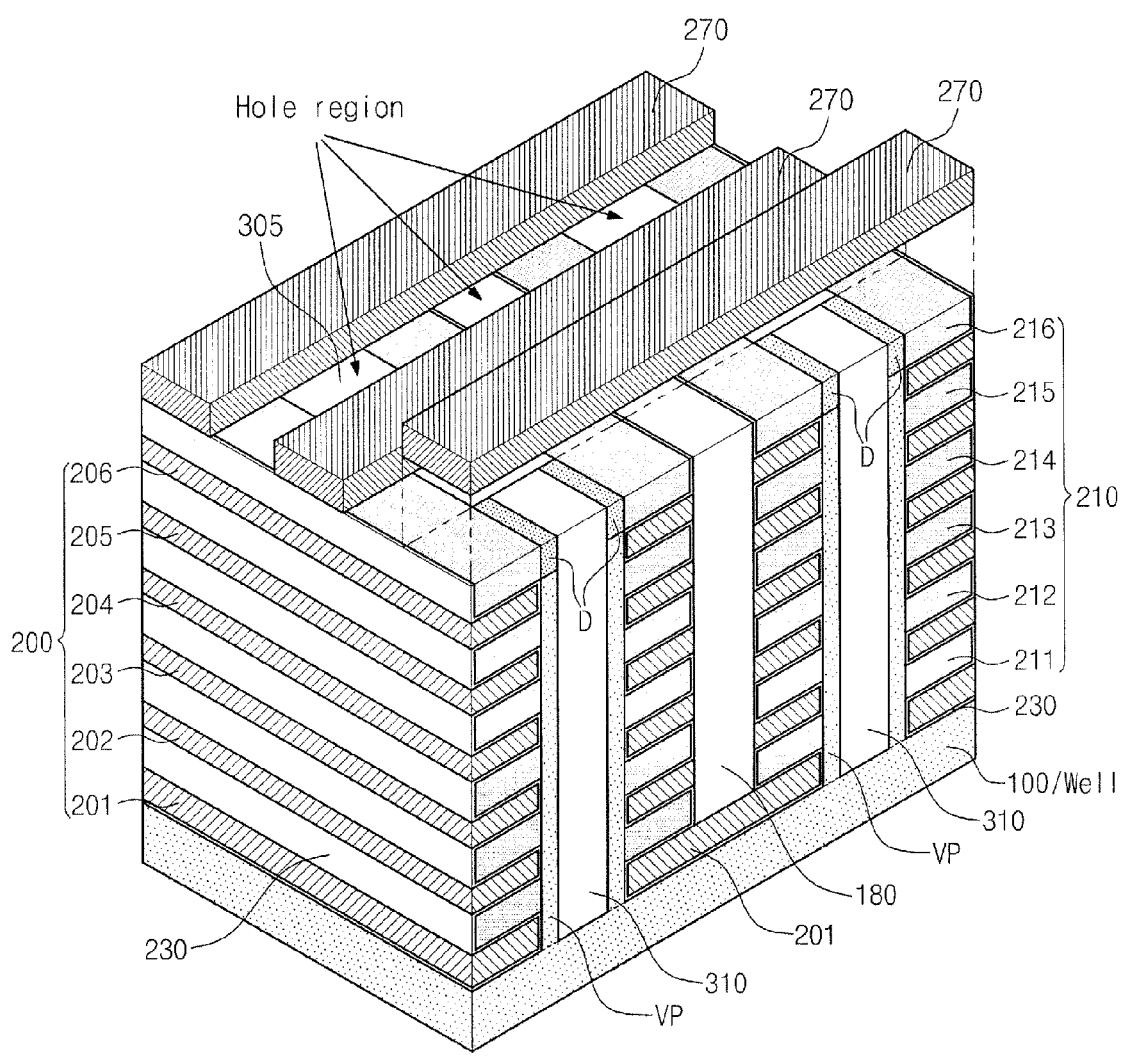

Referring now to FIG. 12, VPs, acting as active regions of the cell string and being separated horizontally from each other, are formed by patterning the semiconductor layer 300 using a mask pattern across the opening 50 or the gate separation region 225', and the topmost gate interlayer dielectric layer 216 an the etch mask, to thereby form hole regions horizontally separating the VPs from each other and exposing the sidewall of the gate structure 200 in the gate separation region 225' between the mask patterns. A drain region D is formed at the top portion of the VP by implanting a different conductivity impurity from the substrate 100. An insulating layer 305 is filled in the hole and then, an upper interconnection layer 270, bit line, etc., is formed electrically connecting to the separated VP.

Figure 13:
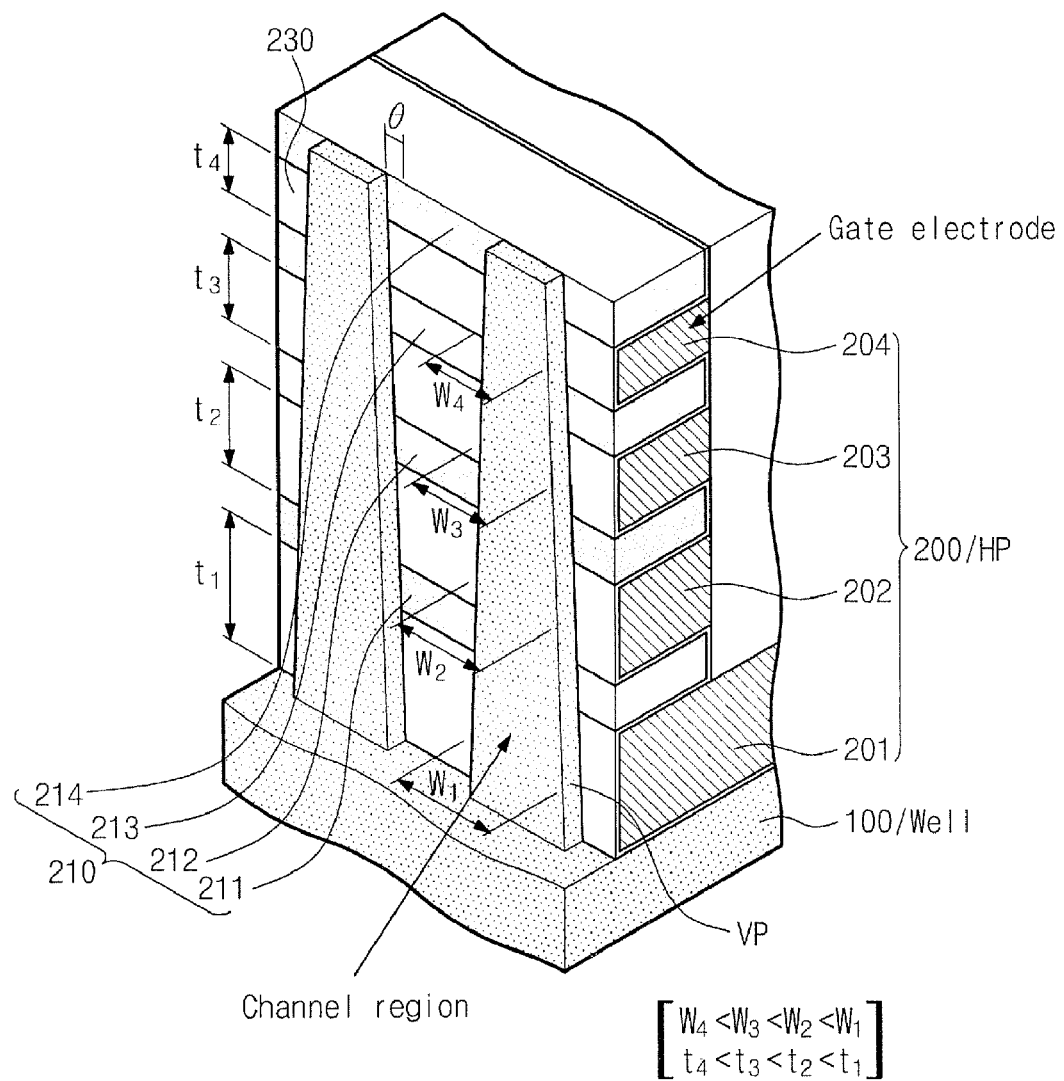
Figure 14:
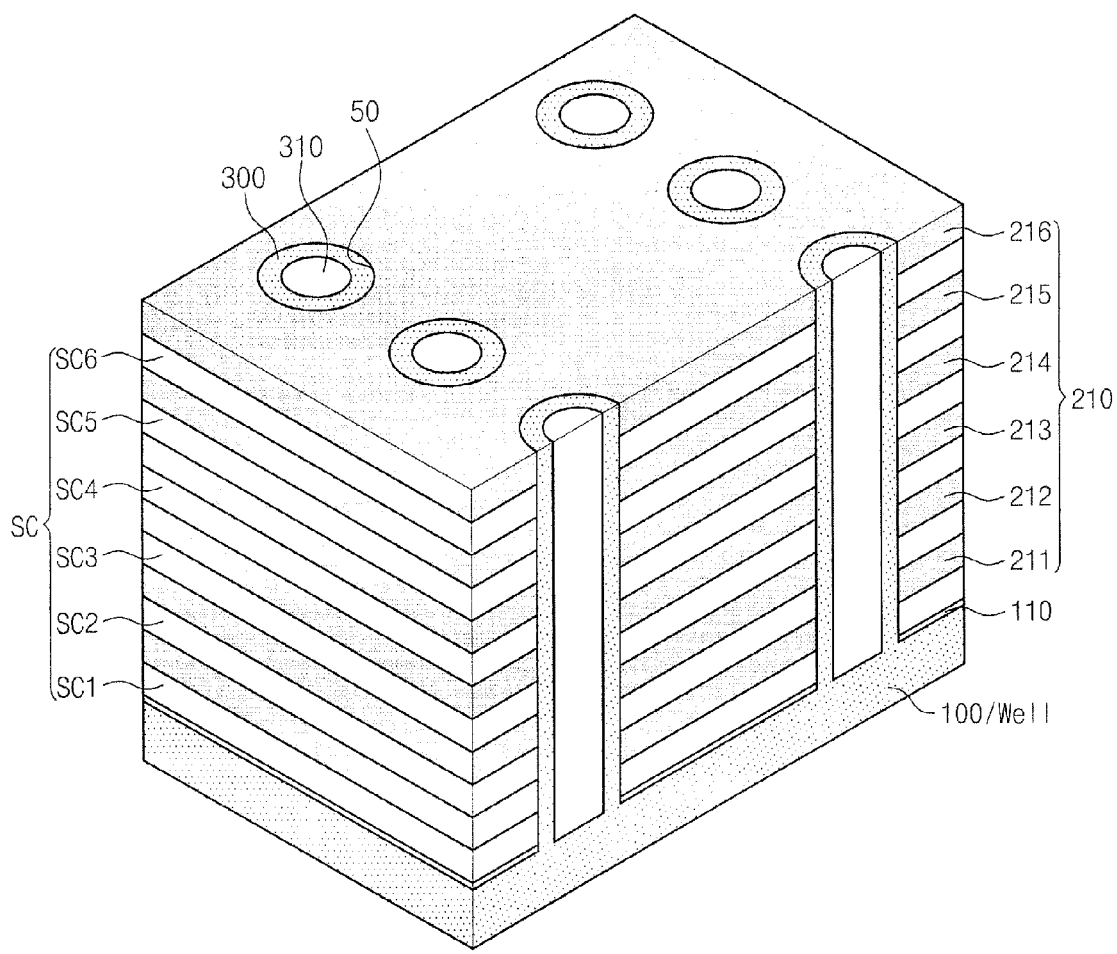
FIGS. 14-18 are perspective views of flash memory devices according to still other embodiments, during intermediate fabrication steps according to still other embodiments.
Figure 15:
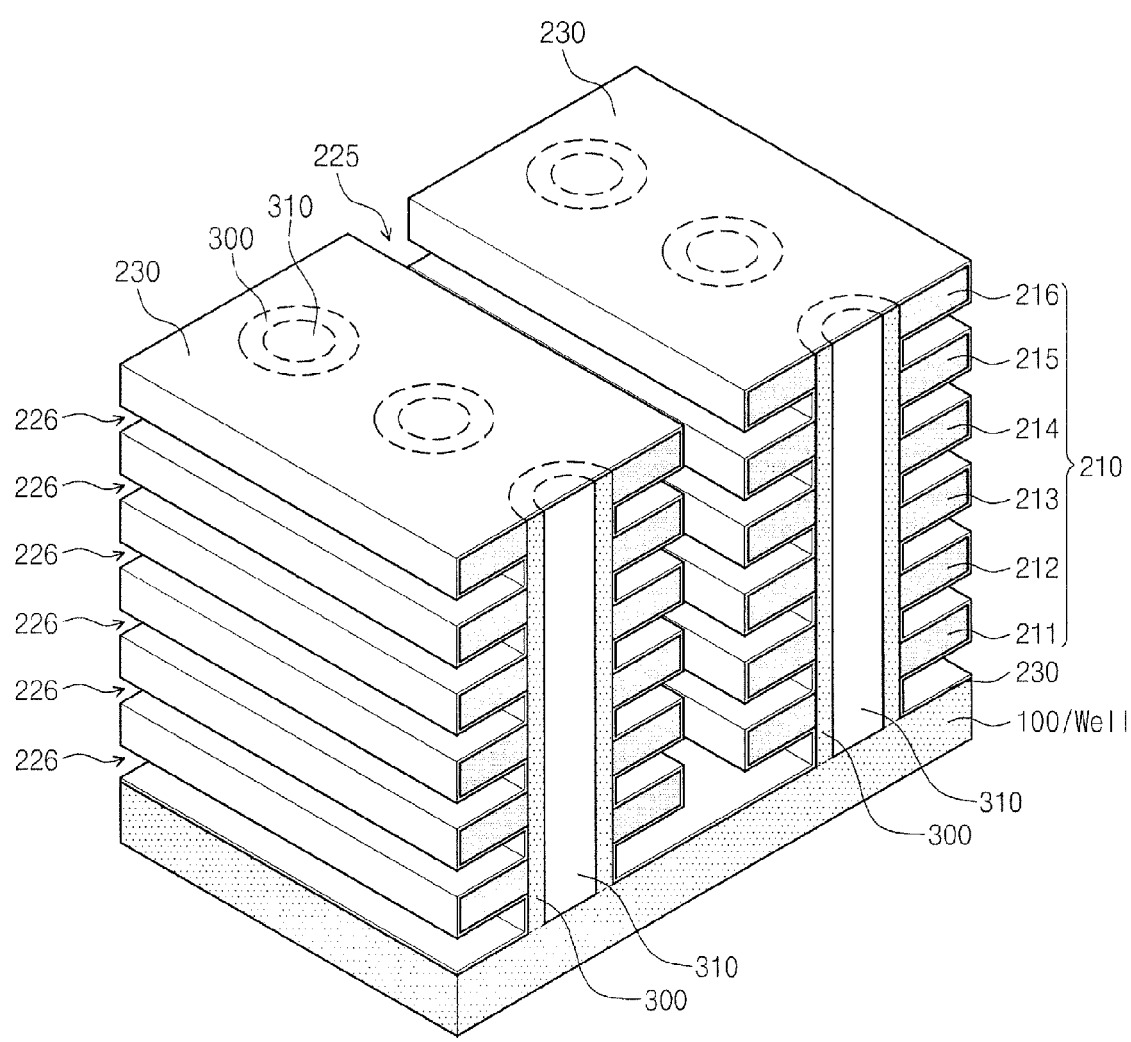
Figure 16:
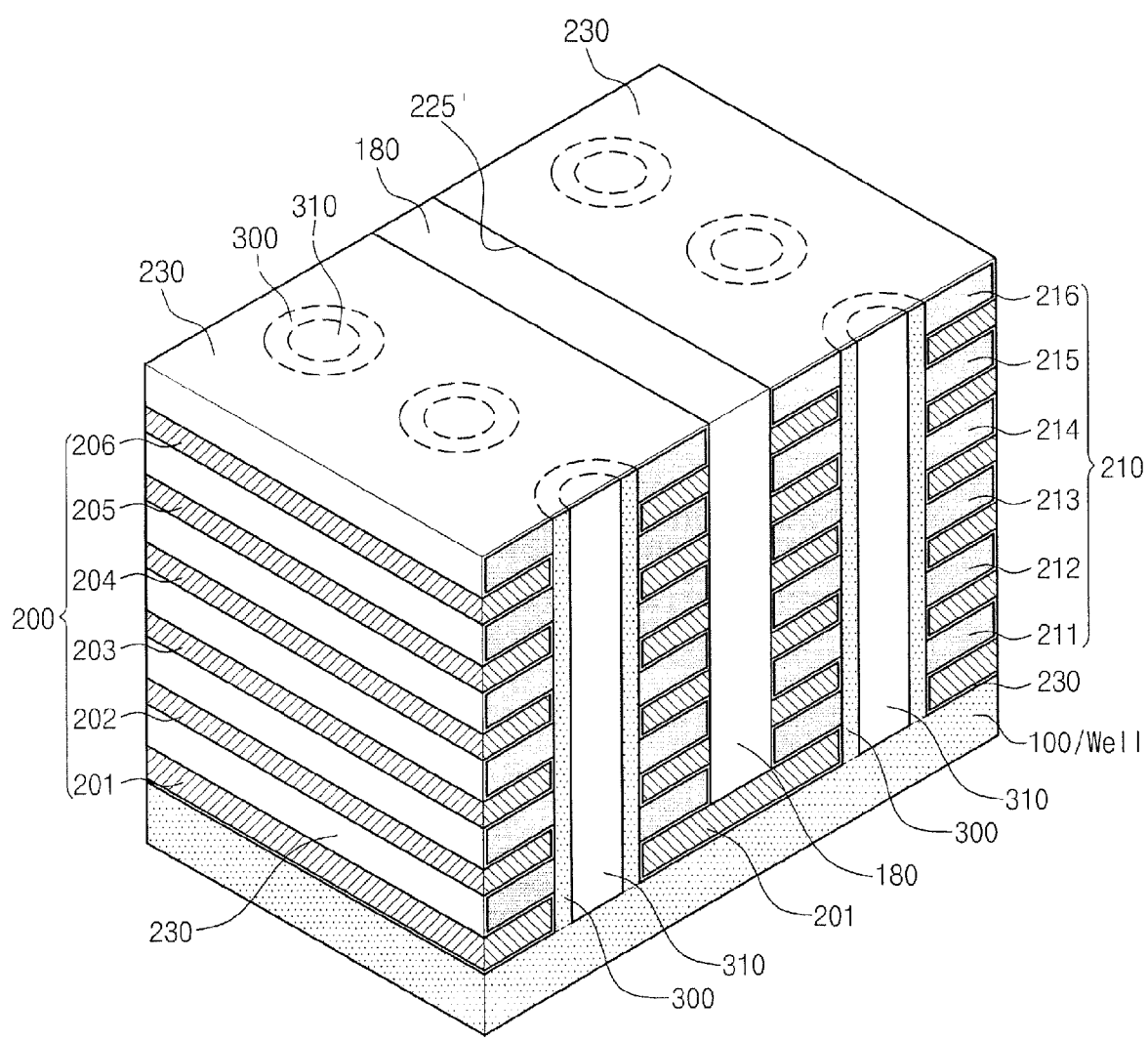
Figure 17:
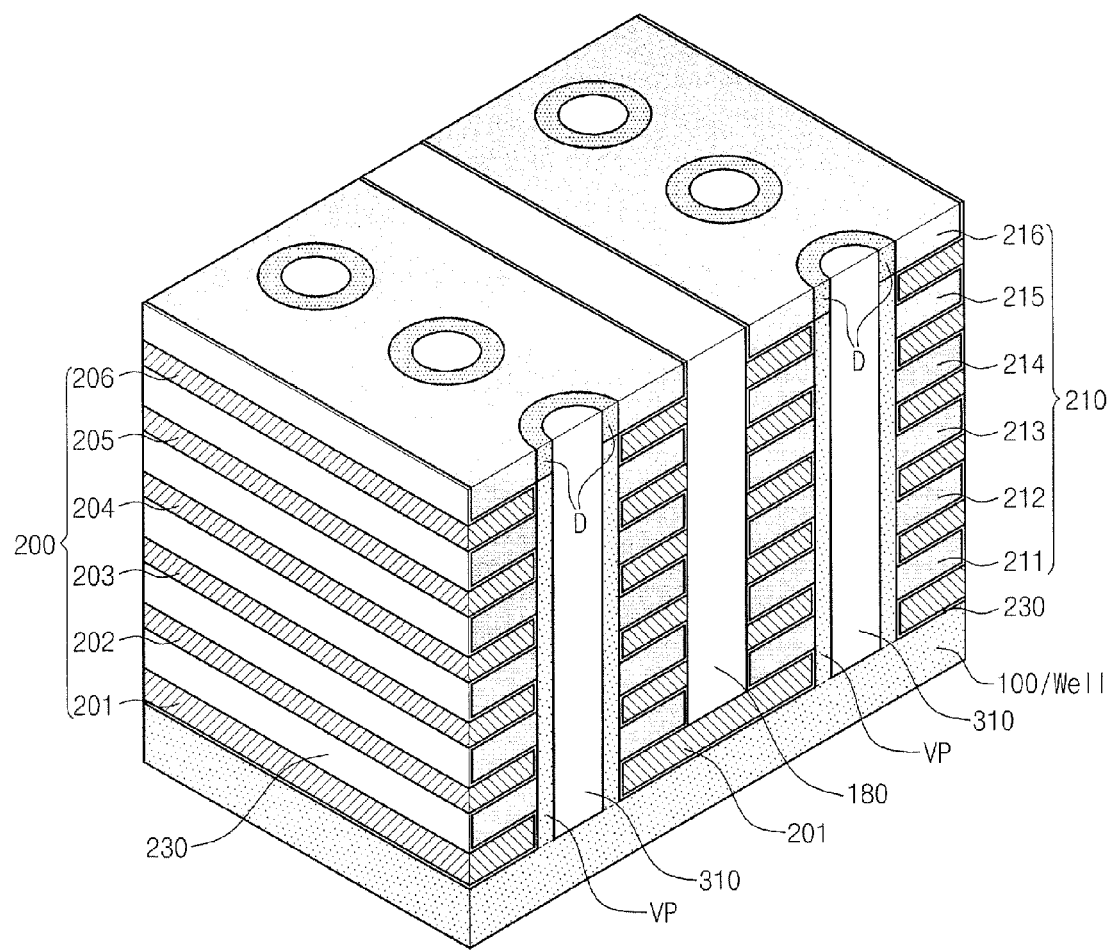
Figure 18:
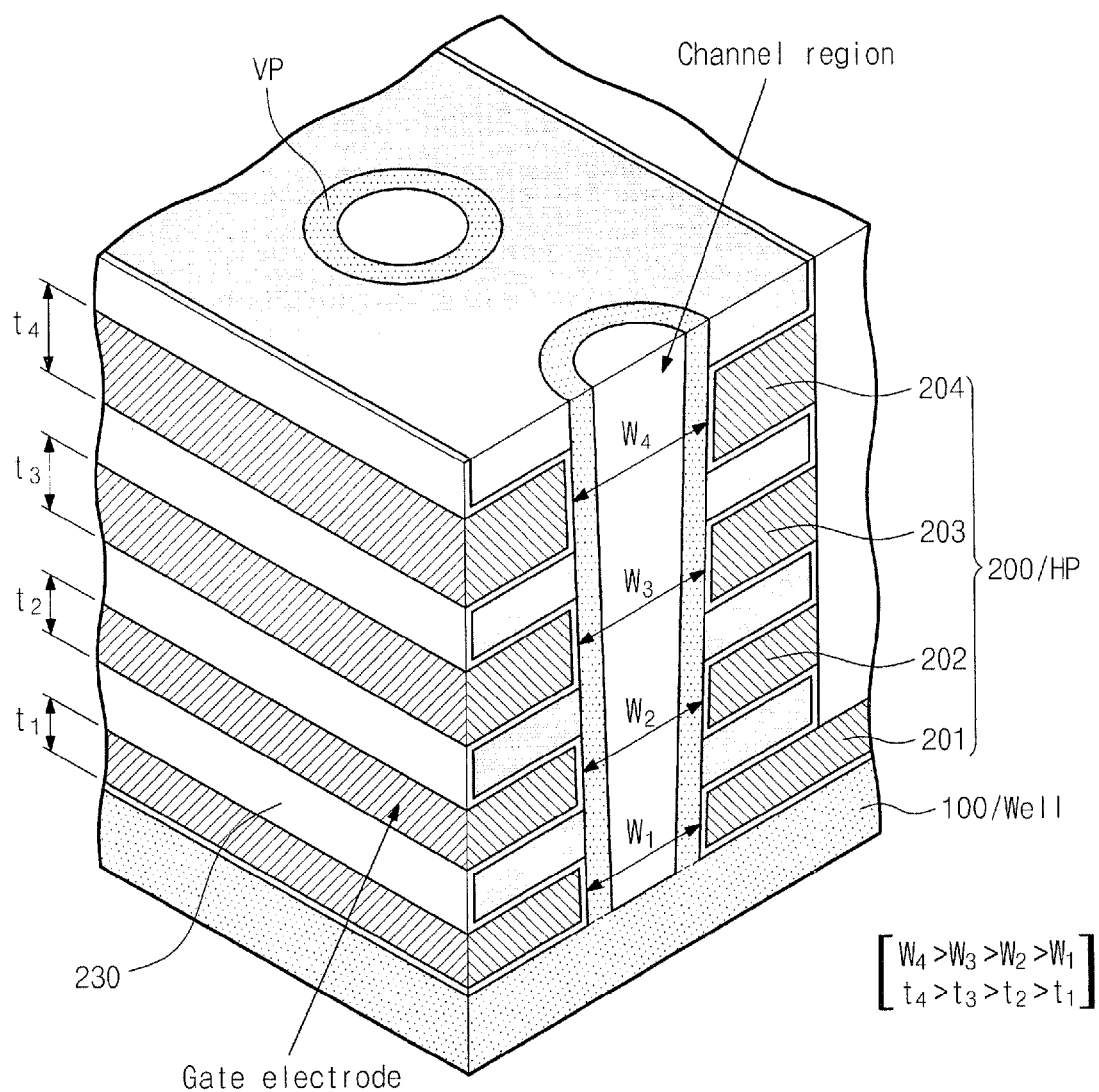

Referring now to FIG. 13, in these embodiments, the width of the VP may be narrower in the upper region than in the lower region due to a patterning process of the anisotropic etch. For example, WU<WL:W4<W3<W2<W1. Thus, the HP may be formed in a thickness to meet Equation 4 for allowing greater interlayer uniformity of the current characteristic of transistor. For example, t1>t2>t3>t4.

FIGS. 14-18 are perspective views of other embodiments that use hole-type openings. Embodiments of FIGS. 14-18 may be fabricated similar to embodiments of FIGS. 9-13, except the shape of the opening 50 and the VP. Accordingly, similar fabrication steps will not be described again in the interest of brevity. The source region S may be formed in the entire surface of the substrate 100 by N+ impurity implantation. The opening 50 is formed in the shape of a hole having a width that increases as a function of distance from the substrate 100. Thus, because the VP also is wider as a function of distance as far from the substrate 100, the channel width of the memory transistor increases a function of distance from the substrate 100. In particular, W4>W3>W2>W1. The VP is formed by filling a semiconductor layer 300 in the hole. In these embodiments, the HP or the gate layers 201-206 may be formed in the thickness to meet Equation 2 to allow increases interlayer uniformity of the current characteristic of transistor. For example, t1<t2<t3<t4.

Figure 19:
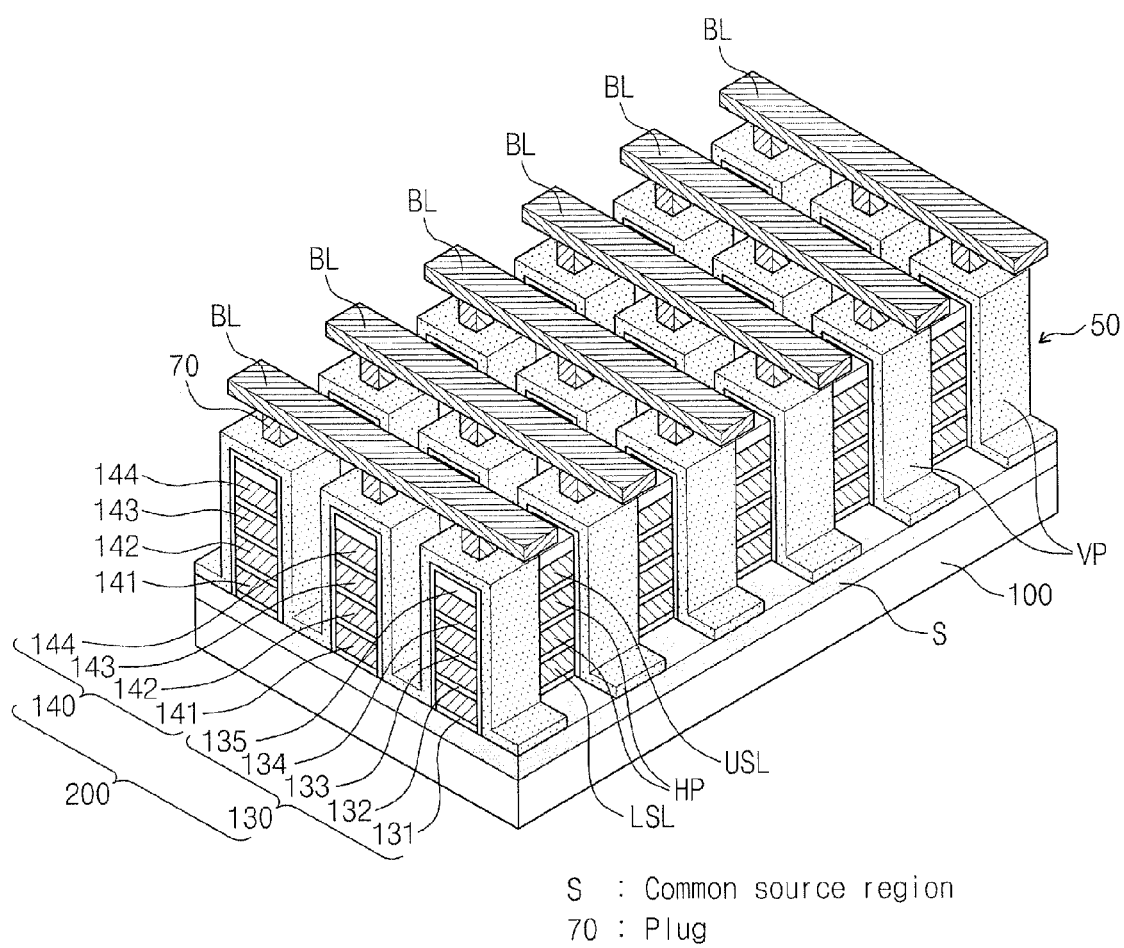
FIG. 19 is a perspective view of flash memory devices according to still other embodiments.
Figure 20:
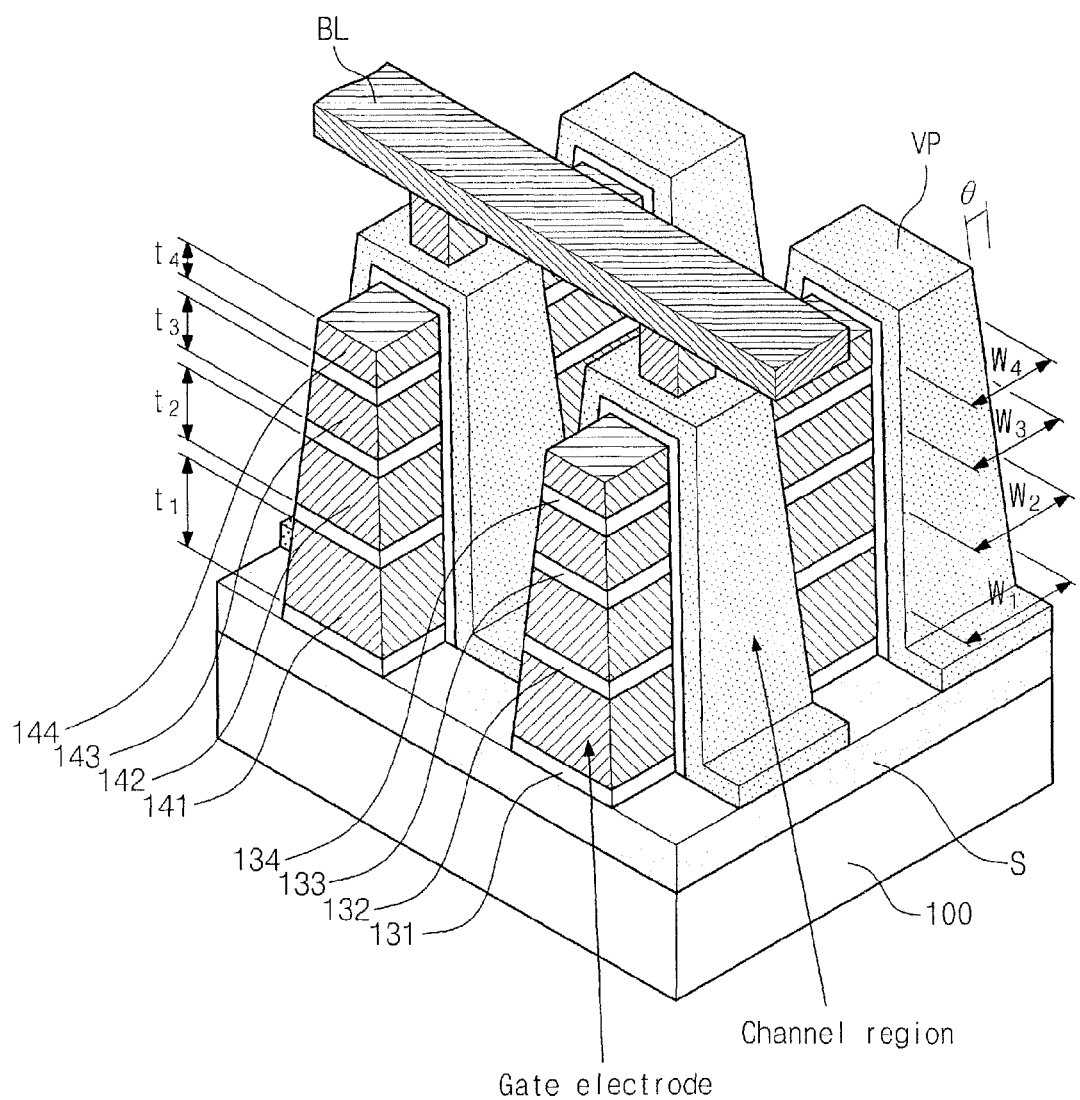
FIG. 20 is an enlarged view of a portion of FIG. 19.

FIGS. 19-20 are perspective views of still other embodiments, wherein FIG. 20 is an enlarged view of a portion of FIG. 19.

Referring to FIGS. 19 and 20, on the substrate 100 a plurality of gate structures 200 are provided that each comprises gate patterns 141-144 and insulation layer patterns 131-135. A plurality of VPs are arranged in the line type shape across the gate structure 200 and each VP is contacted to the top of the gate structure 200 and the bottom of the opening 50 extending from the sidewall of the gate structure 200. Thus, in embodiments of FIGS. 19 and 20, the pillar extends onto the last flash memory cell and also extends between adjacent strings.

Still referring to FIGS. 19 and 20, a gate insulation layer may be provided between the VP and the gate structure 200. The source region S may be formed in the entire surface of the substrate 100 by N+ impurity implantation. The VP is formed by covering the gate structure 200 with a gate insulation layer and a semiconductor layer and then patterning the semiconductor layer along the direction across the gate structure 200. In these embodiments, the width of the VP may be narrower in the upper region than in the lower region due to a patterning process of the anisotropic etch. For example, $W_U<W_L$: W1>W2>W3>W4. Thus, the HP may be formed in the thickness to meet Equation 4 for improving the interlayer uniformity of the current characteristic of transistor. For example, t1>t2>t3>t4.

Figure 21:
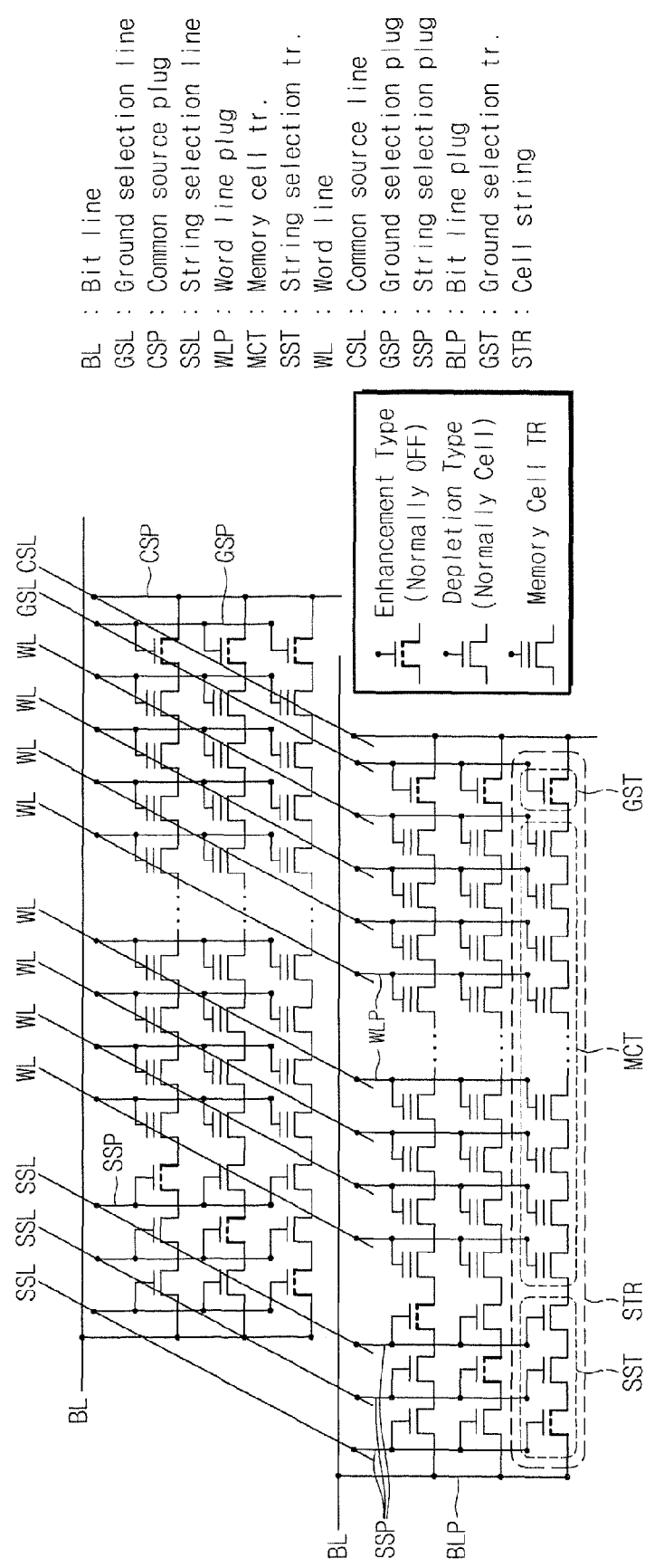
FIG. 21 is a circuit diagram of a NAND flash memory device according to various other embodiments.

FIG. 21 is a circuit diagram of a semiconductor device according to other embodiments. A listing of terms is also provided. As shown, a plurality of cell strings STR is arranged in parallel between the BLP and the CSP. Each STR comprises an SST, MCT and GST that are connected in series to each other.

Figure 22:
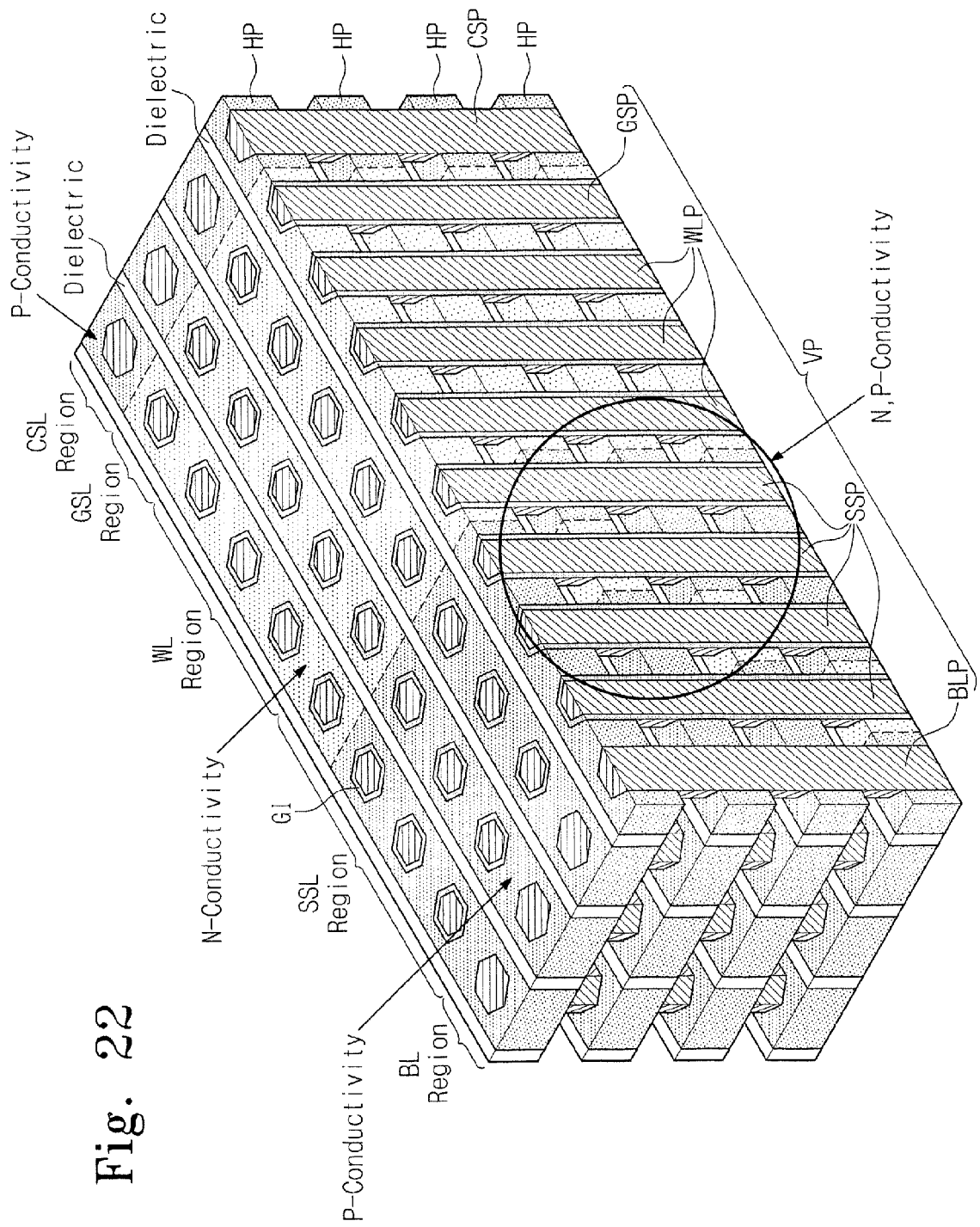
FIG. 22 is a perspective view of embodiments of FIG. 21.
Figure 23:
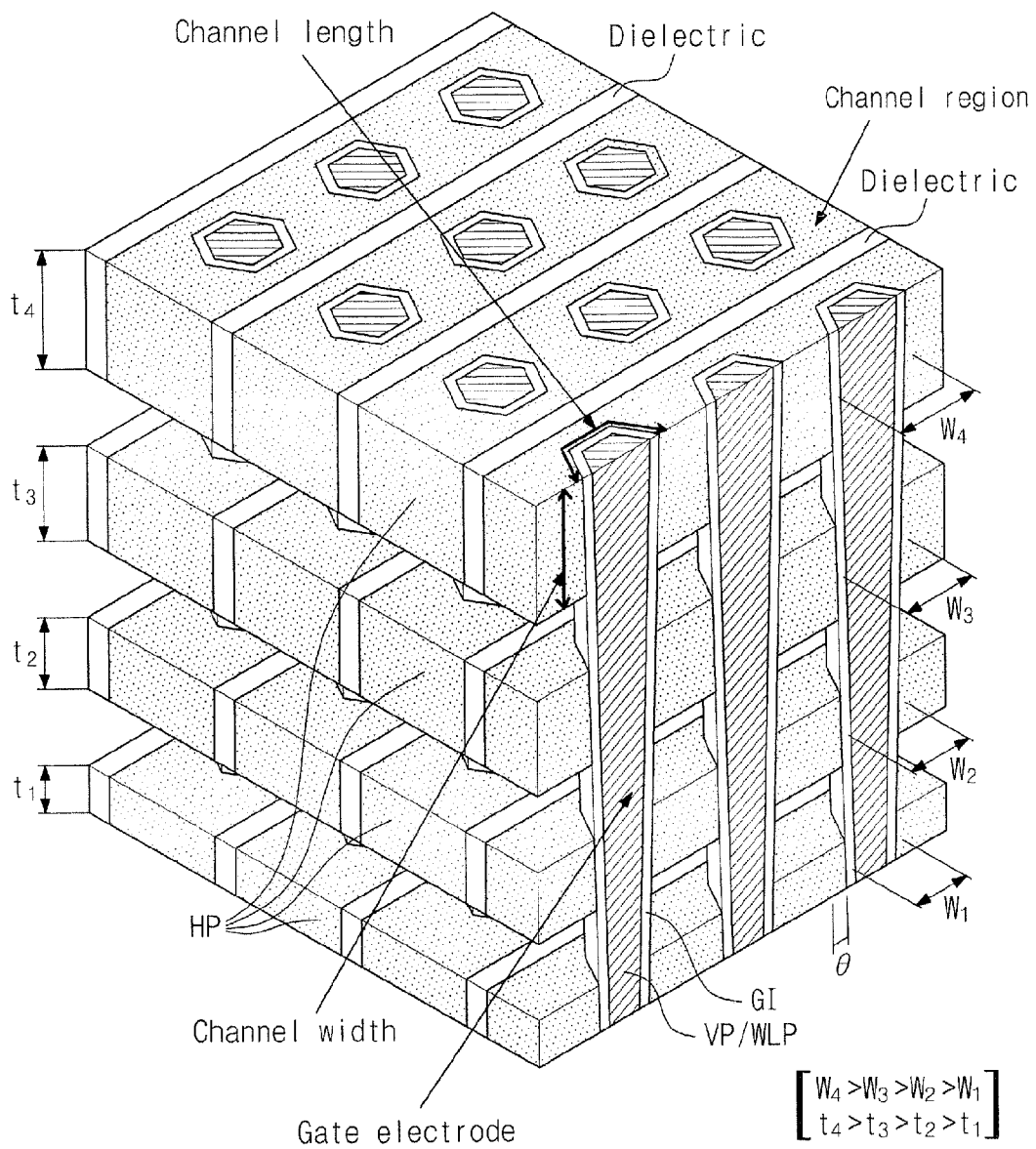
FIG. 23 is a perspective view of an enlarged portion of FIG. 22.

FIG. 22 is a perspective view of embodiments of FIG. 21 and FIG. 23 is an enlarged view of a portion of FIG. 22.

Referring to FIGS. 22 and 23, the HP comprises a cell string including the MCT, SST and GST, being separated horizontally or vertically via dielectrics. The VP is used as BLP, CSP, WLP, SSP and GSP. The gate insulation layer is disposed between the HP and the WLP, SSP, GSP. The WLP, SSP and GSP, respectively, is used as each gate electrode of the MCT, SST, GST that are connected in series between the BLP and the CSP. The source region S may be formed in the entire surface of the substrate 100 by N+ impurity implantation. An HP region adjacent the WLP and GSP is n-type conductivity, whereas an HP region adjacent the BLP and CSP is p-type conductivity in some embodiments. In the SSL region, the n-type conductivity region of the HP comprises an enhancement type transistor, and the p-type conductivity region comprises a depletion transistor. Thus, in these embodiments, the VP is used as the gate electrode and the HP is used as the channel region. Because the VP is wider in the upper region than in the lower region, $W_U>W_L$: W4>W3>W2>W1, the HP may be formed in the thickness to meet Equation 2 to allow increased interlayer uniformity of the current characteristic of transistor. For example, t1<t2<t3<t4.

Figure 24:
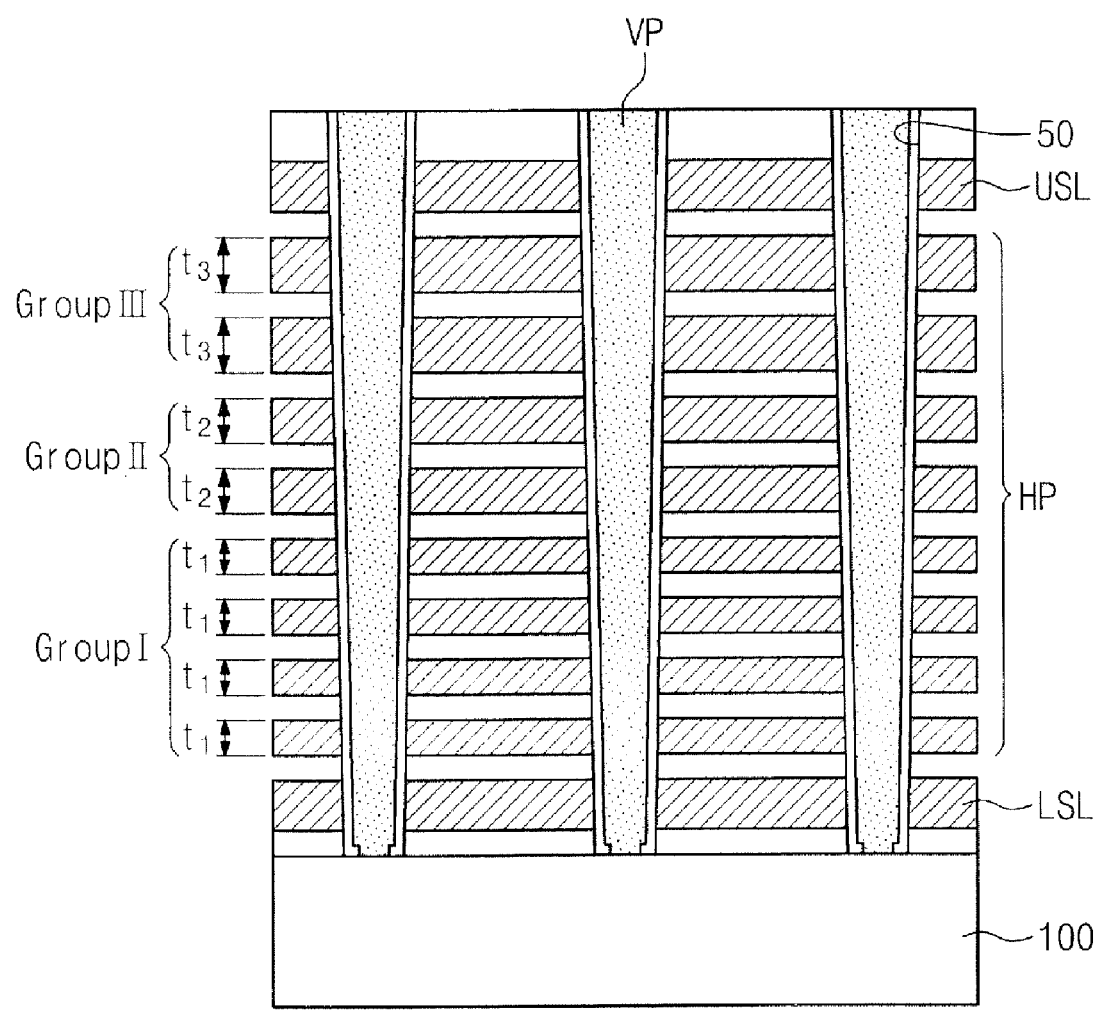
FIG. 24 is a cross-sectional view of flash memory devices according to still other embodiments.

FIG. 24 is a cross-sectional view of other embodiments relating to an HP comprising a plurality of groups, illustrated, for example, as Group I, II, III. In the same group, each HP may have the same thickness, and each HP among the groups may have a different thickness from each other. Thus, in these embodiments, the HP is formed at a thickness to meet the relation t1<t2<t3 and the thicknesses of the USL and LSL differ from the HP thickness. Accordingly, in these embodiments, the string of serially connected flash memory cells comprises a plurality of groups of serially connected flash memory cells. At least two of the series of repeating layer patterns in the given group of serially connected flash memory cells are of same thickness, whereas at least two of the series of repeating layer patterns in different groups of serially connected flash memory cells are of different thicknesses. These embodiments may be particularly applicable in cases where the sidewall slope of the opening 50 is not large. Moreover, in case of a barrel shape, an HP of the same group on opposite sides of a center of the string may be the same.

Figure 25:
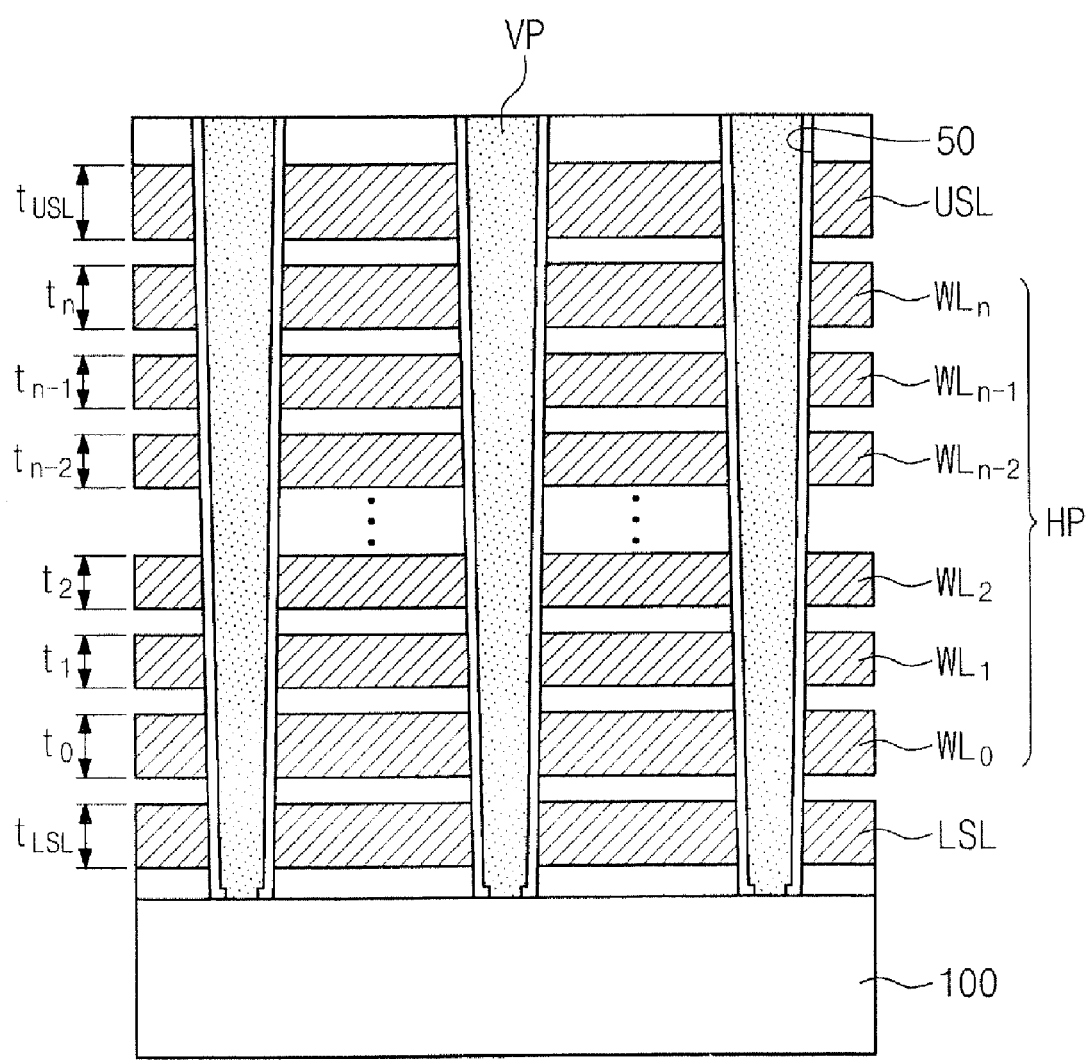
FIG. 25 is a cross-sectional view of flash memory devices according to yet other embodiments.

FIG. 25 is a cross-sectional view of yet other embodiments. In these embodiments, the HPs between the bottommost HP $WL_0$ and the topmost HP $WL_n$ are formed to meet Equations 2 or 4, except at least one of the $WL_0$ and the $WL_n$. The thicknesses $t_{USL}$, $t_{LSL}$ of the USL and the LSL may differ from the thickness of the HP comprising the memory cell transistor. The USL may be formed at the different thickness as the LSL. In some embodiments, the USL thickness is thicker than the LSL thickness. For example, $t_{USL}>t_{LSL}$. Thus, in some embodiments, the layer pattern of the first selection transistor may be of different thickness than the layer pattern of the first flash memory cell and the layer pattern of the second selection transistor may be of different thickness than the layer pattern of the last flash memory cell. Moreover, in other embodiments, the layer pattern of the first selection transistor may be of different thickness than the layer pattern of the second selection transistor.

Figure 26:
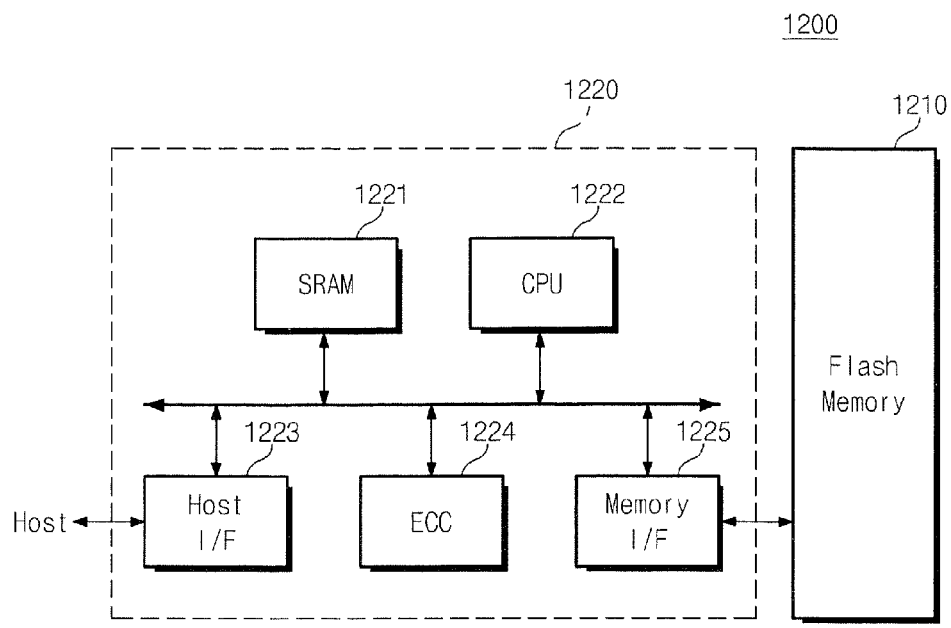
FIG. 26 is a block diagram of a memory card that may comprise a flash memory device according to various embodiments.

FIG. 26 is a block diagram of a memory card 1200 comprising a flash memory device 1210 according to any of the embodiments described herein. The memory card may also include a memory controller 1220 that can include a processing unit 1222, an error correction block 1224, an SRAM 1221, a host interface 1223 and/or a memory interface 1225. The design and operations of these memory controller elements need not be described further herein. A card may be used to store data in the flash memory device 1210 and/or to output data from the card to an external device. The card may be used as a Multi Media Card (MMC), a Secure Digital (SD) card and/or any other conventional card that is used in, for example, portable electronic devices.

Figure 27:
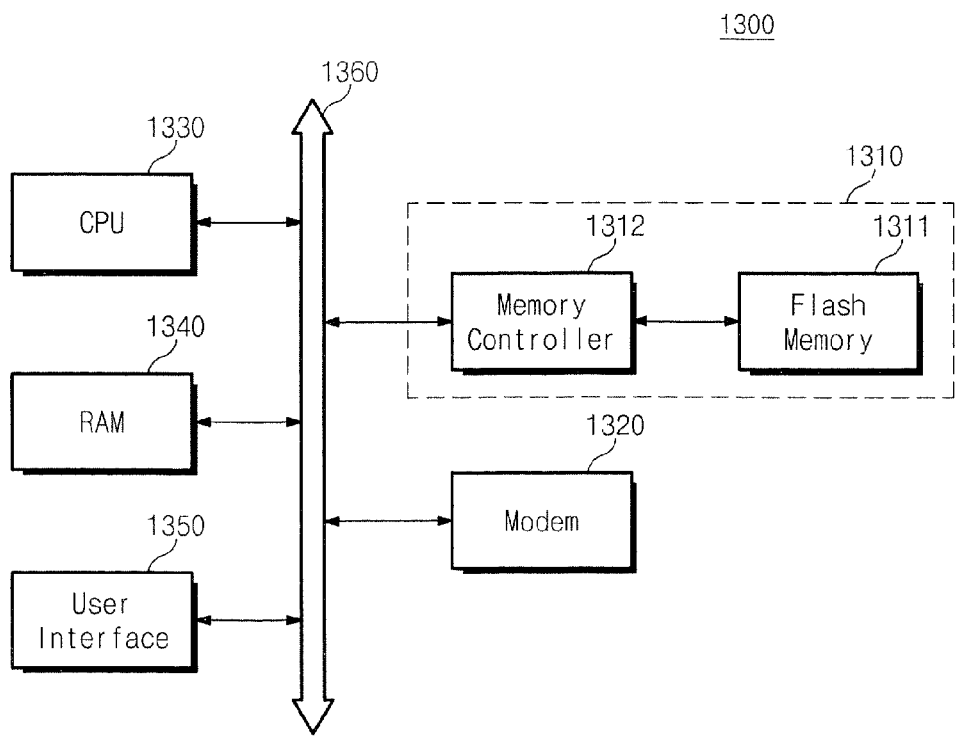
FIG. 27 is a block diagram of an information processing system that may comprise a flash memory device according to various embodiments.

FIG. 27 is a block diagram of an information processing system 1300 comprising a flash memory system 1310 including a flash memory device 1311 according to any of the embodiments described herein. The information processing system may also include a modem 1320, a RAM 1340, a system bus 1360, a flash memory system 1310, a memory controller 1312, a CPU 1330 and/or a user interface 1350. The design and operations of these elements of the information processing system need not be described further herein.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A vertical NAND flash memory device comprising:
a substrate having a face;
a string of serially connected flash memory cells, a first flash memory cell in the string of serially connected flash memory cells being adjacent the face and a last flash memory cell in the string of serially connected flash memory cells being remote from the face; and
a selection transistor adjacent to the string of serially connected flash memory cells;
wherein the string of flash memory cells comprising a series of repeating layer patterns that are stacked on the face and a pillar that extends through the series of repeating layer patterns and that includes at least one oblique wall;
wherein at least two of the series of repeating layer patterns in the string of serially connected flash memory cells are of different thicknesses; and
wherein the pillar is wider remote from the face compared to adjacent the face and wherein the repeating layer patterns are thicker remote from the face compared to adjacent the face.

2. A device according to claim 1 wherein the repeating layer patterns comprise repeating channel layer patterns of the string of serially connected flash memory cells and wherein the pillar comprises gates of the serially connected flash memory cells.

3. A device according to claim 1 wherein the repeating layer patterns comprise repeating gate patterns of the string of serially connected flash memory cells and wherein the pillar comprises channels of the serially connected flash memory cells.

4. A device according to claim 1 wherein the repeating layer patterns comprise repeating patterns of an active layer and an insulating layer and wherein a ratio of thickness of a respective active layer and a width of the pillar adjacent the respective active layer is constant.

5. A device according to claim 1 wherein the selection transistor comprises:
a first selection transistor between the face and the first flash memory cell in the string of serially connected flash memory cells; and
a second selection transistor on the last flash memory cell in the string of serially connected flash memory cells, opposite the face;
wherein the first and second selection transistors both comprise a layer pattern and the pillar extends therethrough;
wherein the layer pattern of the first selection transistor is of different thickness than the layer pattern of the first flash memory cell; and
wherein the layer pattern of the second selection transistor is of different thickness than the layer pattern of the last flash memory cell.

6. A device according to claim 1 wherein the selection transistor comprises:
a first selection transistor between the face and the first flash memory cell in the string of serially connected flash memory cells; and
a second selection transistor on the last flash memory cell in the string of serially connected flash memory cells, opposite the face;
wherein the first and second selection transistors both comprise a layer pattern and the pillar extends therethrough; and
wherein the layer pattern of the first selection transistor is of different thickness than the layer pattern of the second selection transistor.

7. A device according to claim 1 further comprising:
a source region of N+ conductivity on the entire face of the substrate.

8. A device according to claim 1 wherein the pillar has a circular, ellipsoidal, regular polygonal or elongated polygonal cross-sectional shape and includes a wall that extends, at least in part, oblique to the face.

9. A device according to claim 1 wherein the pillar has nonuniform cross-sectional area between the first and last flash memory cell and wherein the series of repeating layers are sufficiently different in thickness so as to reduce drive current variation among the string of serially connected flash memory cells to less than about 20%, notwithstanding the nonuniform cross-sectional area of the pillar.

10. A device according to claim 1 wherein the pillar has nonuniform cross-sectional area between the first and last flash memory cell and wherein the series of repeating layers are sufficiently different in thickness so as to reduce drive current variation among the string of serially connected flash memory cells to less than about 5%, notwithstanding the nonuniform cross-sectional area of the pillar.

11. A device according to claim 1 wherein the repeating layer patterns comprise repeating gate electrode patterns of the string of serially connected flash memory cells and wherein the pillar comprises:
a channel region that extends through the repeating gate electrode patterns, that is of circular cross section and that has an oblique sidewall; and
a blocking insulating layer, a charge storage layer and a tunnel insulating layer between the channel region and the repeating gate electrode patterns.

12. A device according to claim 11 wherein the circular cross section increases with distance away from the face and wherein the thickness of the gate electrode patterns also increases with distance away from the face.

13. A device according to claim 1 wherein the string of serially connected flash memory cells comprises a plurality of groups of serially connected flash memory cells, wherein at least two of the series of repeating layer patterns in a given group of serially connected flash memory cells are of same thickness and wherein at least two of the series of repeating layer patterns in different groups of serially connected flash memory cells are of different thicknesses.

14. A device according to claim 1:
wherein the series of repeating layer patterns includes an opening therein that extends through the series of repeating layer patterns and that includes at least one oblique wall; and
wherein the pillar fills the opening.

15. A device according to claim 1:
wherein the series of repeating layer patterns includes an elongated opening therein that extends through the series of repeating layer patterns;
wherein the pillar is a first pillar that extends along a first wall of the elongated opening and that includes at least one oblique wall;
the device further comprising a second pillar that extends along a second wall of the elongated opening that is opposite the first wall, and wherein the second pillar also includes at least one oblique wall.

16. A device according to claim 1:
wherein the series of repeating layer patterns includes an elongated opening therein that extends through the series of repeating layer patterns; and
wherein the pillar extends from a first wall of the elongated opening to a second wall of the elongated opening that is opposite the first wall.

17. A device according to claim 1 wherein the pillar extends onto the last flash memory cell.

18. A device according to claim 1 in combination with a memory controller to provide a memory card.

19. A vertical NAND flash memory device comprising:
a substrate having a face;
a string of serially connected flash memory cells, a first flash memory cell in the string of serially connected flash memory cells being adjacent the face and a last flash memory cell in the string of serially connected flash memory cells being remote from the face; and
a selection transistor adjacent to the string of serially connected flash memory cells;
wherein the string of flash memory cells comprising a series of repeating layer patterns that are stacked on the face and a pillar that extends through the series of repeating layer patterns and that includes at least one oblique wall;
wherein at least two of the series of repeating layer patterns in the string of serially connected flash memory cells are of different thicknesses; and
wherein the series of repeating layer patterns in the string of serially connected flash memory cells increases in thickness from the first flash memory cell to the last flash memory cell.

20. A vertical microelectronic device comprising:
a substrate having a face; and
a plurality of transistors that are stacked on the face, a first transistor in the stack being adjacent the face and a last transistor in the stack being remote from the face;
the plurality of transistors that are stacked on the face comprising a plurality of repeating layer patterns that are stacked on the face and a pillar that extends through the plurality of repeating layer patterns and that includes at least one oblique wall, the at least one oblique wall causing the plurality of transistors that are stacked on the face to have different current drive characteristics;
wherein at least two of the plurality of repeating layer patterns are of different thicknesses, so as to reduce the different current drive characteristics that are caused by the at least one oblique wall; and
wherein the pillar is wider remote from the face compared to adjacent the face and wherein the repeating layer patterns are thicker remote from the face compared to adjacent the face.

21. A device according to claim 20 wherein the repeating layer patterns comprise repeating channel layer patterns of the plurality of transistors that are stacked on the face, and wherein the pillar comprises gates of the plurality of transistors that are stacked on the face.

22. A device according to claim 20 wherein the repeating layer patterns comprise repeating gate patterns of the plurality of transistors that are stacked on the face and wherein the pillar comprises channels of the plurality of transistors that are stacked on the face.

23. A device according to claim 20 wherein the repeating layer patterns comprise repeating patterns of an active layer and an insulating layer and wherein a ratio of thickness of a respective active layer and a width of the pillar adjacent the respective active layer is constant.

24. A device according to claim 20 wherein the pillar has a circular, ellipsoidal regular polygonal or elongated polygonal cross-sectional shape and includes a wall that extends, at least in part, oblique to the face.

25. A device according to claim 20 wherein the series of repeating layer patterns in the plurality of transistors that are stacked on the face increase in thickness from the first transistor to the last transistor.

26. A device according to claim 20 wherein the pillar has nonuniform cross-sectional area between the first transistor and the last transistor and wherein the series of repeating layers are sufficiently different in thickness so as to reduce drive current variation among the plurality of transistors that are stacked on the face to less than about 20%, notwithstanding the nonuniform cross-sectional area of the pillar.

27. A device according to claim 20 wherein the pillar has nonuniform cross-sectional area between the first transistor and the last transistor and wherein the series of repeating layers are sufficiently different in thickness so as to reduce drive current variation among the plurality of transistors that are stacked on the face to less than about 5%, notwithstanding the nonuniform cross-sectional area of the pillar.

28. A device according to claim 20 wherein the plurality of transistors that are stacked on the face comprises a plurality of groups of transistors that are stacked on the face, wherein at least two of the series of repeating layer patterns in a given group of transistors are of same thickness and wherein at least two of the series of repeating layer patterns in different groups of transistors are of different thicknesses.

29. A device according to claim 20 further comprising:
a source region of N+ conductivity on the entire face of the substrate.

\* \* \* \* \*